(12) United States Patent
Nagai

(10) Patent No.: US 8,425,226 B2
(45) Date of Patent: Apr. 23, 2013

(54) HEAT TREATMENT APPARATUS AND METHOD OF MANUFACTURING SEMICONDUCTOR DEVICE

(75) Inventor: Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/633,029

(22) Filed: Dec. 8, 2009

(65) Prior Publication Data
US 2010/0087014 A1    Apr. 8, 2010

Related U.S. Application Data

(63) Continuation of application No. PCT/JP2007/063037, filed on Jun. 28, 2007.

(51) Int. Cl.
*F27B 9/40*     (2006.01)
*F27D 19/00*    (2006.01)

(52) U.S. Cl.
USPC .................................. 432/37; 257/E21.002

(58) Field of Classification Search ............... 438/3, 17, 438/113, 761; 257/E21.599, E21.24, E21.531, 257/E21.008, E21.002; 432/23, 37
See application file for complete search history.

(56) References Cited

U.S. PATENT DOCUMENTS

| | | | |
|---|---|---|---|
| 4,891,334 A | 1/1990 | Satoh et al. | |
| 5,271,732 A * | 12/1993 | Yokokawa | 432/241 |
| 5,645,419 A * | 7/1997 | Ohsawa et al. | 432/241 |
| 5,820,679 A | 10/1998 | Yokoyama et al. | |
| 5,858,863 A | 1/1999 | Yokoyama et al. | |
| 6,036,793 A * | 3/2000 | Melgaard et al. | 148/708 |
| 6,099,598 A | 8/2000 | Yokoyama et al. | |
| 6,200,023 B1 * | 3/2001 | Tay et al. | 374/161 |
| 6,310,147 B1 | 10/2001 | Urakami et al. | |
| 6,501,191 B2 * | 12/2002 | Tanaka et al. | 219/390 |
| 6,778,232 B2 | 8/2004 | Nakata et al. | |
| 6,902,709 B1 * | 6/2005 | Harada et al. | 422/177 |
| 7,062,344 B2 | 6/2006 | Yokoyama et al. | |
| 7,310,563 B2 | 12/2007 | Yokoyama et al. | |
| 7,392,106 B2 | 6/2008 | Yokoyama et al. | |
| 7,603,194 B2 | 10/2009 | Yokoyama et al. | |
| 2005/0194535 A1 * | 9/2005 | Noji et al. | 250/311 |
| 2008/0105204 A1 * | 5/2008 | Nakada et al. | 118/728 |

FOREIGN PATENT DOCUMENTS

| | | |
|---|---|---|
| JP | 5-198564 A | 8/1993 |
| JP | 05-198564 A | 8/1993 |
| JP | 2567685 B2 | 12/1996 |

(Continued)

OTHER PUBLICATIONS

International Search Report of PCT/JP2007/063037, mailing date of Oct. 2, 2007.

(Continued)

*Primary Examiner* — Fernando L Toledo
*Assistant Examiner* — Neil Prasad
(74) *Attorney, Agent, or Firm* — Westerman, Hattori, Daniels & Adrian, LLP

(57) ABSTRACT

Provided is a heat treatment apparatus including a treatment chamber housing a silicon substrate, a heater being provided in the treatment chamber and heating the silicon substrate, and an atmosphere adjustment mechanism reducing a concentration of oxygen contained in an atmosphere inside the treatment chamber to less than an oxygen concentration in the air. The atmosphere adjustment mechanism is provided with an oxygen trap, for example.

7 Claims, 34 Drawing Sheets

FOREIGN PATENT DOCUMENTS

| | | |
|---|---|---|
| JP | 2000-053748 A | 2/2000 |
| JP | 2001-131469 A | 5/2001 |
| JP | 2002-035684 A | 2/2002 |
| JP | 2002-257474 A | 9/2002 |
| JP | 2002-343708 A | 11/2002 |
| JP | 2003-029297 A | 1/2003 |
| JP | 2003-286330 A | 10/2003 |
| JP | 2005-062764 A | 3/2005 |
| JP | 2005-142377 A | 6/2005 |
| JP | 3654597 B2 | 6/2005 |
| JP | 2005-268532 A | 9/2005 |
| JP | 2006-005223 A | 1/2006 |
| JP | 2007-5394 A | 1/2007 |
| JP | 2007-005394 A | 1/2007 |
| WO | 01/20650 A1 | 3/2001 |

OTHER PUBLICATIONS

Japanese Office Action dated Aug. 14, 2012, issued in corresponding Japanese Patent Application No. 2009-520266, (8 pages). With English Translation.

Japanese Office Action dated Feb. 26, 2013 issued in corresponding Japanese Patent Application No. 2009-520266.

* cited by examiner

1000nm

1000nm

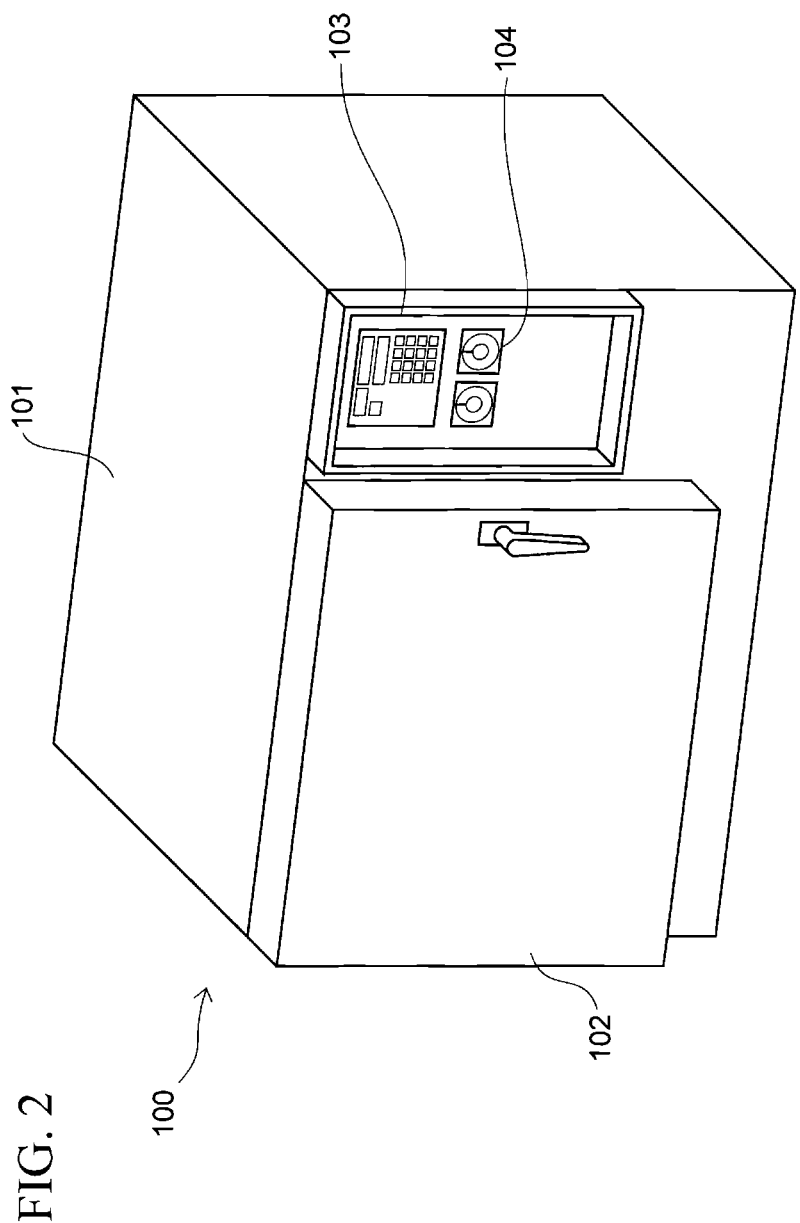

US 8,425,226 B2

HEAT TREATMENT APPARATUS AND METHOD OF MANUFACTURING SEMICONDUCTOR DEVICE

CROSS-REFERENCE TO RELATED APPLICATIONS

This application is based upon prior International Patent Application No. PCT/JP2007/063037, filed on Jun. 28, 2007, the entire contents of which are incorporated herein by reference.

FIELD

It is related to a heat treatment apparatus and a method of manufacturing a semiconductor device.

BACKGROUND

Ferroelectric random access memories (FeRAMs), which allows ferroelectric capacitors to retain information by utilizing polarization inversion of ferroelectric substances, are developed in recent years. A ferroelectric memory is a nonvolatile memory which does not lose retained information even when being powered off, and is particularly drawing attentions because of its ability to achieve high integration, high-speed drive, high durability, low power consumption, and so forth.

A ferroelectric oxide having a perovskite crystal structure with a large residual polarization amount, such as PZT (Pb(Zr,Ti)$O_3$) or SBT (SrBi$_2$Ta$_2$O$_9$), is mainly used as a material of a capacitor dielectric film constituting a ferroelectric capacitor.

Such a ferroelectric oxide is easily reduced by a reducing substance such as water or hydrogen and its ferroelectric characteristics such as residual polarization amount are thereby deteriorated. Accordingly, how to protect a capacitor against a reducing substance is an important factor in manufacturing a ferroelectric memory.

A protection insulating film for blocking water and the like is formed as the uppermost layer of a ferroelectric memory. The protection insulating film also has a role to protect the ferroelectric memory against a rays and mechanical impacts. Usually, a polyimide film is formed as the protection insulating film.

However, a polyimide film discharges water when being cured and cross-linked. Accordingly, there is a problem in the polyimide film that a ferroelectric capacitor is apt to be deteriorated by water. Moreover, a substrate needs to be heated to a relatively high temperature of 250° C. to 350° C. for achieving complete cross-linking of polyimide, and the ferroelectric capacitor is apt to be damaged by the heat as well.

Although polyimide is commonly used as a protection insulating film for typical types of memories including a DRAM (dynamic random access memory) and a flash memory, a new film to replace the polyimide film is required as a protection insulating film for a ferroelectric memory in order to prevent the above problems.

As a protection insulating film which replaces the polyimide film, a novolac resin film is proposed in Japanese Laid-open Patent Publication No. 2005-62764. As disclosed in Japanese Laid-open Patent Publication No. 2003-29297 and Japanese Patent No. 2567685, a novolac resin is a material originally used as a main component of a photoresist. According to Japanese Laid-open Patent Publication No. 2005-62764, a protection insulating film excellent in coating and adhesion properties is obtained by adding an amide-acid polymer to an alkali-soluble phenol novolac resin or an alkali-soluble cresol novolac resin.

Note that techniques related to the present application are also disclosed in Japanese Laid-open Patent Publication No. 2005-62764, Japanese Laid-open Patent Publication No. 2003-29297, Japanese Patent No. 2567685, International Publication Pamphlet No. WO 01/020650, Japanese Laid-open Patent Publication No. 2002-343708, Japanese Laid-open Patent Publication No. 2006-5223, and Japanese Patent No. 3654597.

SUMMARY

According to one aspect discussed herein, a heat treatment apparatus includes a treatment chamber housing a semiconductor substrate, a heater provided in the treatment chamber and heating the semiconductor substrate, and an atmosphere adjustment mechanism reducing a concentration of oxygen contained in an atmosphere in the treatment chamber to less than an oxygen concentration in an air.

According to another aspect discussed herein, a method of manufacturing a semiconductor device includes forming an element in a semiconductor substrate, forming a film, which contains a novolac resin, over the element as an uppermost protection insulating film, and after forming the protection insulating film, heating the semiconductor substrate in an atmosphere having an oxygen concentration reduced to less than an oxygen concentration in the air.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 2 is a perspective view of a heat treatment apparatus used in a first embodiment;

DESCRIPTION OF EMBODIMENT

Results of investigations conducted by the inventor of the present application will be described prior to describing the embodiments.

A novolac resin generates less water at the time of cross-linking as compared to polyimide. Moreover, a novolac resin only requires a low substrate temperature ranging from 160° C. to 180° C. for a complete cross-link. Therefore, a novolac resin film is considered to be most suitable for a protection insulating film of the ferroelectric memory which is weak against heat and water.

Meanwhile, a semiconductor device such as a ferroelectric memory undergoes various electrical tests before shipment. Those tests include a test which is executed by heating a semiconductor device in the wafer level in an atmosphere in order to check whether or not the semiconductor device normally operates within an operation-guaranteed temperature range.

It is found out, however, that when such a test associated with a heating process in the atmosphere is executed on a semiconductor device having a protection insulating film formed of a novolac resin film, unevenness is formed on a surface of the protection insulating film with the heat and result in a defect on the semiconductor device.

Figure 1A:
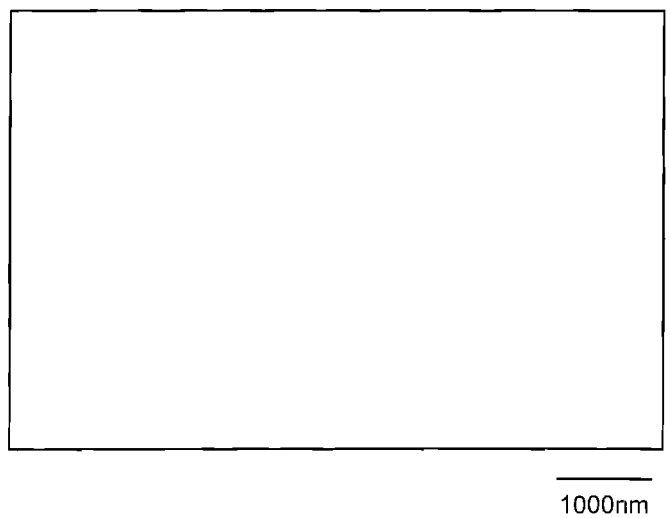
FIG. 1A is a plan view of a novolac resin film, which is not subjected to a heat treatment, drawn based on a surface SEM (scanning electron microscope) image.

FIG. 1A is a plan view of a novolac resin film, which is not subjected to a heat treatment, drawn based on a surface SEM (scanning electron microscope) image. On the other hand, FIG. 1B is a plan view of a novolac resin film drawn when subjected to a heat treatment at a substrate temperature of 200° C. in the atmosphere for 4 hours.

As depicted in FIG. 1A, the surface of the novolac resin film remains flat when no heat treatment is performed.

Figure 1B:
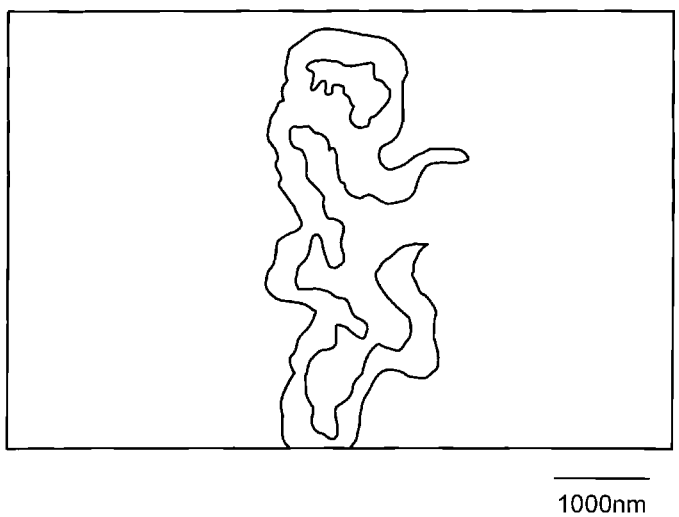
FIG. 1B is a plan view of a novolac resin film, which is subjected to a heat treatment, drawn based on a surface SEM image.

On the other hand, as depicted in FIG. 1B, unevenness is formed on the surface of the novolac resin film subjected to the heat treatment.

The inventor of the present application presumes that the unevenness on the surface of the novolac resin film is attributed to a reduction in film density at a portion of the film where molecular binding of the novolac resin is disconnected due to the heat treatment at a high temperature (equal to or above 180° C., for example) in the atmosphere containing oxygen.

When the portion in which the film density is reduced is present in the protection insulating film, such a portion leads to a reduction in film density in a wider area. As a consequence, reliability of the protection insulating film is degraded.

Further, the color of the protection insulating film thus deteriorated is changed into brown. When resin sealing is performed in this state, detachment occurs between the sealing resin and the protection insulating film. This causes water to be accumulated in the detached portion and to thereby deteriorate the ferroelectric capacitor.

In view of these problems, the inventor of the present application has devised the embodiments to be described below.

(First Embodiment)

Heat Treatment Apparatus

FIG. 2 is a perspective view of a heat treatment apparatus used in this embodiment.

A heat treatment apparatus 100 is configured to perform a heat treatment in an atmosphere adjusted to have an oxygen concentration and a hydrogen concentration lower than that in the air outside the apparatus 100, and includes a treatment chamber 101 which is shielded from the outside air with a door 102. A control panel 103 for allowing an operator to set a heat treatment temperature and a heat treatment period is disposed on a front face of the treatment chamber 101. A temperature meter 104 for indicating an actual temperature in the treatment chamber 101 is disposed below the control panel 103.

Figure 3:
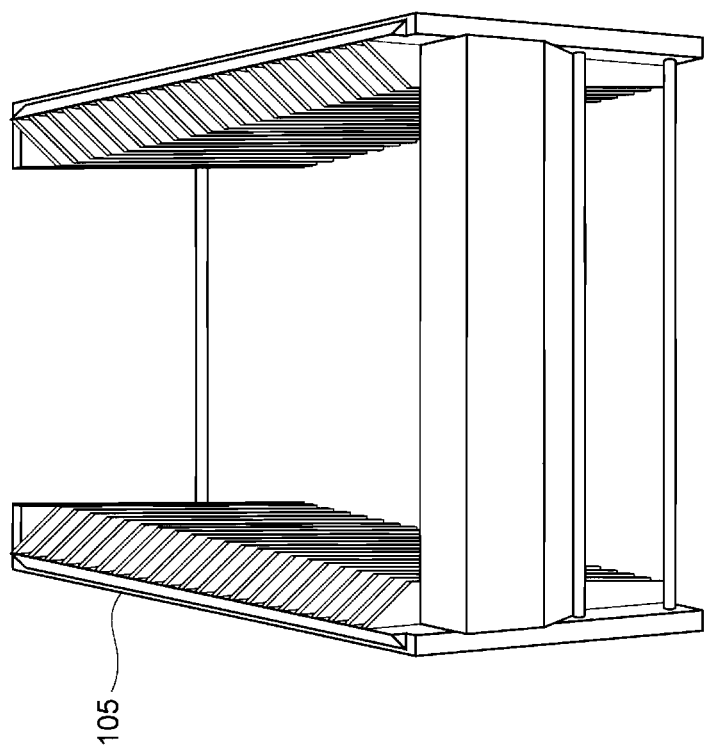
FIG. 3 is a perspective view of a wafer cassette used in the respective embodiments.

FIG. 3 is a perspective view of a wafer cassette 105 used in this heat treatment apparatus 100. One lot (consisting of 25 sheets) of silicon (semiconductor) substrates are housed in the wafer cassette 105. The heat treatment apparatus 100 is capable of housing multiple wafer cassettes 105, 4 pieces for example, at a time and performing a heat treatment simultaneously on the multiple silicon substrates housed in these wafer cassettes 105.

Figure 4:
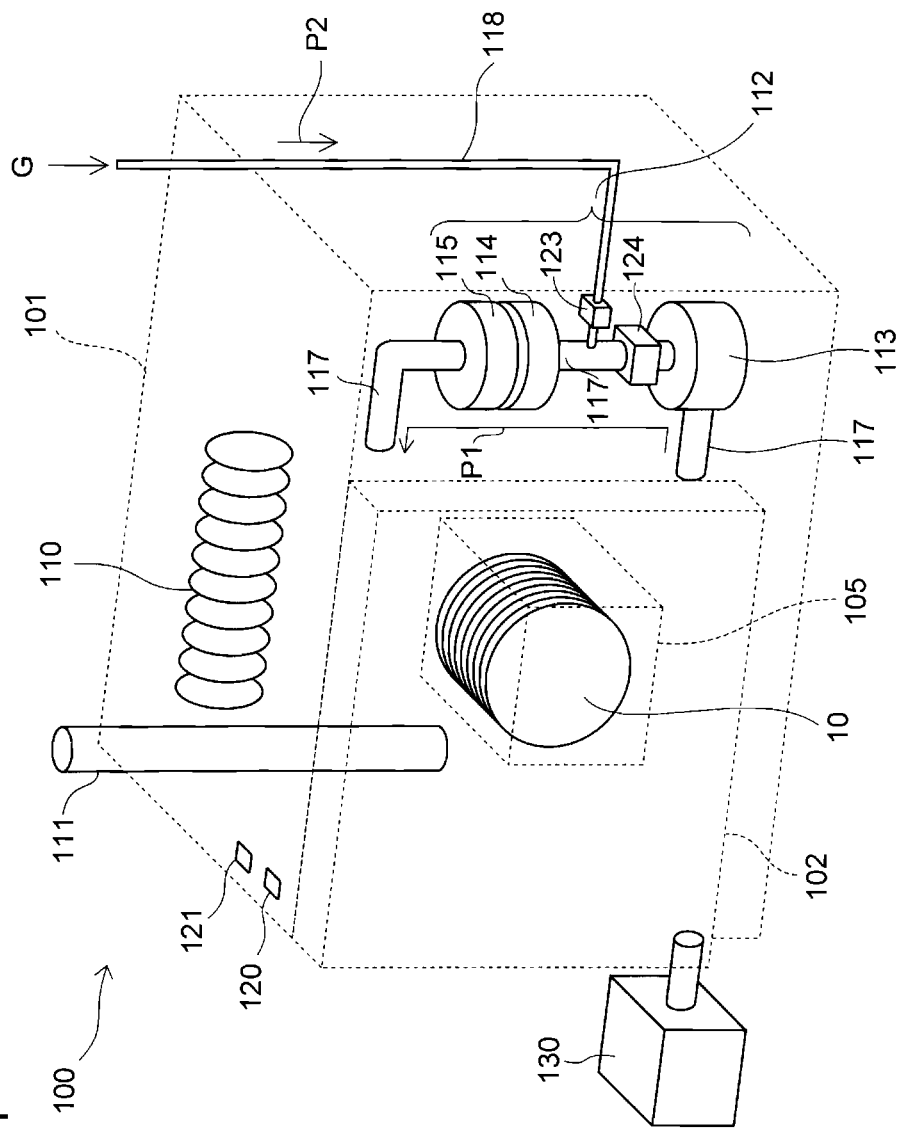
FIG. 4 is a perspective view depicting a more detailed structure of the heat treatment apparatus used in the first embodiment.

FIG. 4 is a perspective view depicting a more detailed structure of the heat treatment apparatus 100.

A resistance heating heater 110 for heating silicon substrates 10 is provided in the treatment chamber 101. The heating temperature and heating period of the heater 110 can be set at any desired value via the control panel 103 (see FIG. 2).

In order to prevent the silicon substrates 10 from being overheated by the heater 110, a heat exhaust duct 111 for releasing heat in the treatment chamber 101 to outside is provided on a rear face of the treatment chamber 101. Here, the heat exhaust duct 111 may be omitted when the temperature of an atmosphere in the treatment chamber 101 is easily controllable without the heat exhaust duct 111.

An air exhaust pump 130 for reducing the pressure of an atmosphere in the treatment chamber 101 is provided on a side face of the treatment chamber 101. The heat treatment can be performed under a reduced-pressure atmosphere by operating this air exhaust pump 130. It is to be noted, however, that the air exhaust pump 130 is not essential and the heat treatment may be performed at an atmospheric pressure without the air exhaust pump 130.

Here, an atmosphere in the treatment chamber 101 is circulated by an atmosphere adjustment mechanism 112.

The atmosphere adjustment mechanism 112 has a circulating fan 113, a hydrogen trap 114, and an oxygen trap 115 which are arranged in this order from the upstream of an internal pipe 117. The atmosphere adjustment mechanism 112 operates so as to circulate an atmosphere in the treatment chamber 101 along a circulation path P1.

The hydrogen trap 114 operates so as to selectively remove hydrogen in the atmosphere. Any titanium-based hydrogen absorbing alloy such as $Ti_2Ni$, TiNi, TiFe, and TiPd, for example, may be used as the hydrogen trap 114. On the contrary, the oxygen trap 115 operates so as to selectively remove oxygen in the atmosphere. The "Oxygen Trap" made by GL Sciences, Inc., for example, may be applied for the oxygen trap 115.

The hydrogen concentration and oxygen concentration of an atmosphere circulated along the circulation path P1 are reduced as compared to those in the air outside the apparatus 100 by making the atmosphere pass through the hydrogen trap 114 and the oxygen trap 115.

An external pipe 118 for introducing a cooling gas G of room temperature is connected to the internal pipe 117 at a position upstream of the traps 114 and 115. The cooling gas G is nitrogen or air, for example, and is introduced into the treatment chamber 101 along an introduction path P2 as illustrated in FIG. 4. By introducing the cooling gas G into the treatment chamber 101 from the upstream of the traps 114 and 115 in this manner, the concentrations of hydrogen and oxygen in the cooling gas G are reduced as compared to those in the air outside the apparatus 100.

Here, an open-close valve 123 is provided in the external pipe 118. The open-close valve 123 is closed to shut down the supply of the cooling gas G when no introduction of the cooling gas G is needed.

Moreover, a back-flow check valve 124 is provided downstream of the circulating fan 113 to prevent the cooling gas G from accidentally flowing in the opposite direction to that of the circulation path P1.

The oxygen concentration and hydrogen concentration of an atmosphere in the treatment chamber 101 are measured by an oxygen concentration meter 120 and a hydrogen concentration meter 121, respectively. As the oxygen concentration meter 120, a "Digital Oxygen Concentration Meter X0-326ALA" manufactured by Tech Jam Co., Ltd can be used, for example. In the meantime, as the hydrogen concentration meter 121, a "H2 EC Sensormodule" manufactured by MST Technology GmbH can be used, for example.

Semiconductor Device

As described above, the heat treatment apparatus 100 is configured to perform a heat treatment in the atmosphere having the oxygen concentration lower than that in the air outside the apparatus 100, and is preferably used in a manufacturing process of a semiconductor device, such as a FeRAM, which employs a novolac resin as a protection insulating film that is susceptible to deterioration by a heat treatment in an oxygen atmosphere.

Figure 5:
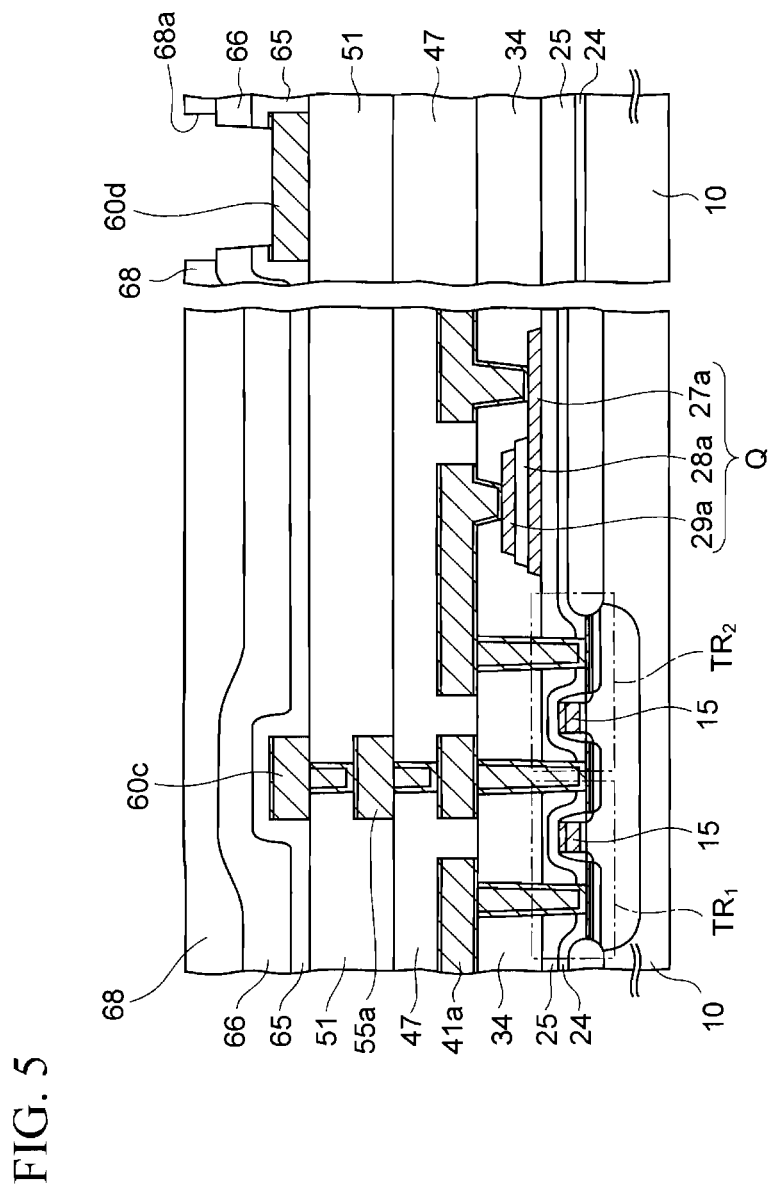
FIG. 5 is a cross-sectional view of a FeRAM to be subjected to a heat treatment in the respective embodiments.

FIG. 5 is a cross-sectional view of the FeRAM.

This FeRAM includes first and second MOS transistors $TR_1$ and $TR_2$ formed on the silicon substrate 10, the transistors each having a gate electrode 15 and the like. A cover insulating film 24 made of silicon nitride and a base insulating film 25 made of silicon oxide are formed on these MOS transistors $TR_1$ and $TR_2$.

Moreover, a ferroelectric capacitor Q is formed on the base insulating film 25 as an element. The ferroelectric capacitor Q has a lower electrode 27a, a capacitor dielectric film 28a, and an upper electrode 29a stacked in this order. Of these films, a PZT film is formed as the capacitor dielectric film 28a, for example.

On the ferroelectric capacitor Q, a first interlayer insulating film 34, a first-layer metal interconnection 41a, a second interlayer insulating film 47, a second-layer metal interconnection 55a, a third interlayer insulating film 51, and a third-layer metal interconnection 60c are stacked in this order. Here, a bonding pad 60d is also formed on the same layer as that of the third-layer metal interconnection 60c.

Further, a first passivation film 65 made of silicon oxide and a second passivation film 66 made of silicon nitride are formed on the third-layer metal interconnection 60c to prevent outside water from reaching the capacitor Q.

Then, as an upper most protection insulating film 68, a resin film mainly composed of a novolac resin is formed on the second passivation film 66.

The protection insulating film 68 is formed in the following procedure. First, a coating film containing a novolac resin is firstly formed by applying a photosensitive novolac resin on the second passivation film 66 and then baking the photosensitive novolac resin at a substrate temperature of about 110° C. Subsequently, a window 68a, from which the bonding pad 60d exposes, is formed by exposing and developing the coating film. Thereafter, the novolac resin in the coating film is completely cross-linked by curing the coating film at a substrate temperature in a range from about 160° C. to 180° C.

The protection insulating film 68 mainly composed of the novolac resin has a smaller amount of water generated at the curing process and requires a lower substrate temperature for the curing than a polyimide film. Accordingly, the capacitor dielectric film 28a made of a ferroelectric material such as PZT is less likely to be deteriorated by water or heat.

Meanwhile, after the uppermost protection insulating film 68 is formed as depicting in FIG. 5, an electrical test is performed in order to check whether or not the MOS transistors $TR_1$ and $TR_2$ and the ferroelectric capacitor Q operate normally.

The electrical test is performed at the wafer level before cutting the silicon substrate 10 into separate pieces of semiconductor chips.

After the electrical test is completed, the silicon substrate 10 is cut into separate pieces of semiconductor chips, and each chip is subjected to resin sealing.

In this embodiment, the electrical test and the resin sealing process are performed by use of the above-described heat treatment apparatus 100. Now, their processes will be described below in detail.

Electrical Test and Resin Sealing

Figure 6:
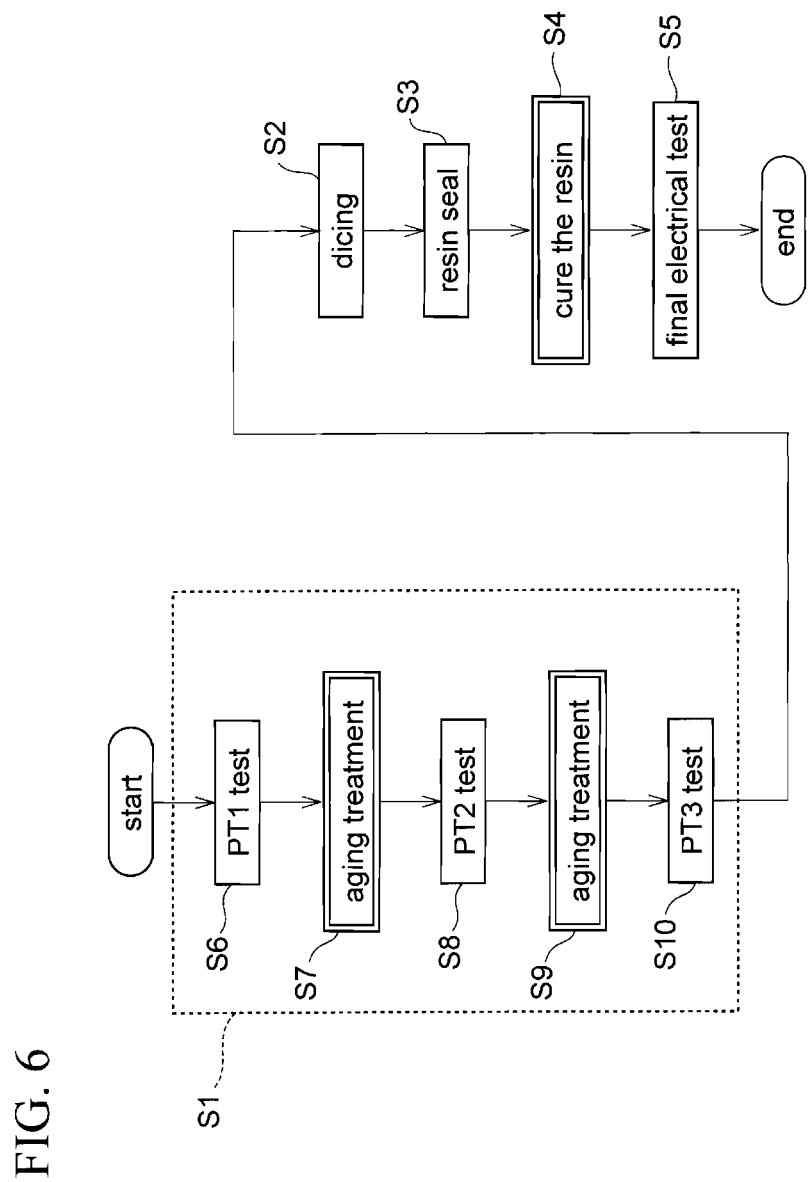
FIG. 6 is a flowchart of processes to be executed after a protection insulating film is formed in the respective embodiments.

FIG. 6 is a flowchart of processes to be performed after the protection insulating film 68 is formed as described above.

A first step S1 depicted in FIG. 6 represents a testing step of subjecting the FeRAM to a retention test (a data retention test).

The testing step S1 is subdivided into steps S6 to S10.

Of these steps, in step S6, a functional test is performed for checking whether or not the first and second MOS transistors $TR_1$ and $TR_2$ normally perform switching operations even when a power-supply voltage fluctuates or when an operation timing shifts. This test is executed by applying a predetermined test voltage to the gate electrode 15. Such a test is sometimes called a PT1 test.

This test is performed while heating the substrate by using a test apparatus. However, since the test requires a low substrate temperature of 90° C., the protection insulating film 68 containing a novolac resin is hardly deteriorated.

Thereafter, information "1" is written in the capacitor Q.

Subsequently, the process goes to step S7. In step S7, the silicon substrate 10 is put into the heat treatment apparatus 100 depicted in FIG. 2 and is heated under conditions of a temperature equal to or above a practical temperature range, for example a substrate temperature of 200° C., and a treatment period of 4 hours to apply a heat load on the FeRAM. This process of applying the heat load for the testing purpose is called an aging treatment.

Next, the process goes to step S8. In step S8, a test is executed for checking whether or not the information "1" written in the capacitor Q in step S6 still remains readable after the aging treatment. This test is also called a PT2 test.

When there is any capacitor Q from which the information "1" cannot be read in this PT2 test, the semiconductor chip including the capacitor Q is eliminated as a defective product.

On the other hand, in the semiconductor chip including the capacitor Q from which the information "1" can be read, opposite information "0" is written in the capacitor Q.

Although this PT2 test is performed while heating the substrate similar to the PT1 test, a novolac resin in the protection insulating film 68 is hardly deteriorated because the substrate temperature is set as low as 90° C.

Subsequently, the process goes to step S9. In step S9, the silicon substrate 10 is put into the heat treatment apparatus 100 and is subjected to the aging treatment again. The conditions of the aging treatment are, for example, a substrate temperature of 200° C., and a treatment period of 4 hours.

Then, after this aging treatment is completed, the process goes to step S10. In step S10, a test is executed for checking whether or not the information "0" written in the capacitor Q in step S8 remains readable. This test is also called a PT3 test.

When there is any capacitor Q from which the information "0" cannot be read in this PT3 test, the semiconductor chip including the capacitor Q is eliminated as a defective product.

On the other hand, in the semiconductor chip including the capacitor Q from which the information "0" can be read, a predetermined test voltage is applied on the gate electrode 15 again to test the switching functions of the first and second MOS transistors $TR_1$ and $TR_2$. The semiconductor chip which passes this test for the switching functions is recognized as a non-defective product and is sent to a subsequent process.

Although this PT3 test is performed while heating the substrate similar to the PT1 test and the PT2 test, a novolac resin in the protection insulating film 68 is hardly deteriorated because the substrate temperature is set as low as 90° C.

In this way, the testing step S1 is completed.

Figure 7:
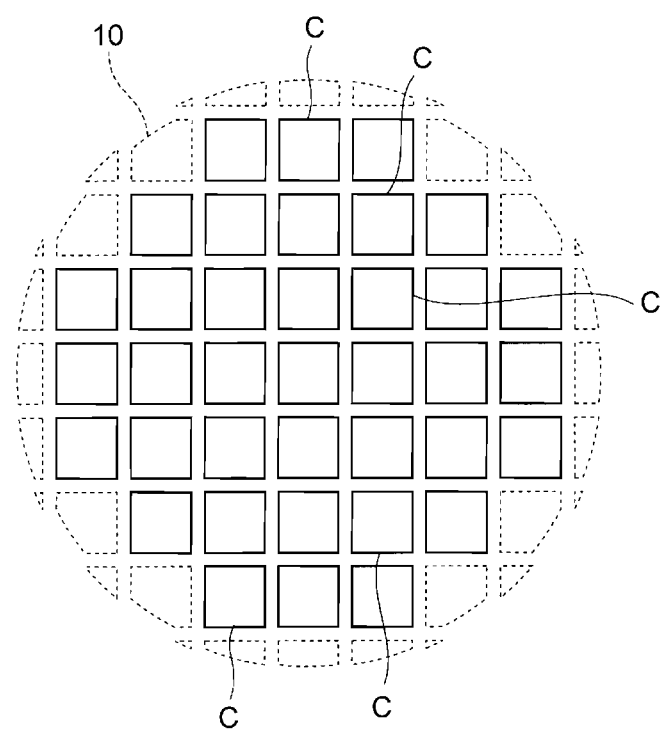
FIG. 7 is a plan view schematically depicting semiconductor chips diced into separate pieces.

Thereafter, the process goes to step S2. In step S2, the silicon substrate 10 is diced into separate semiconductor chips. FIG. 7 is a plan view schematically depicting semiconductor chips C thus diced into separate pieces.

Figure 8A:
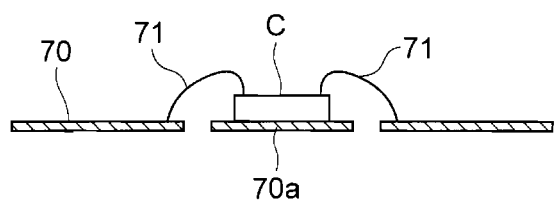
FIGS. 8A and 8B are cross-sectional views for explaining step S3 in FIG. 6.
Figure 8B:
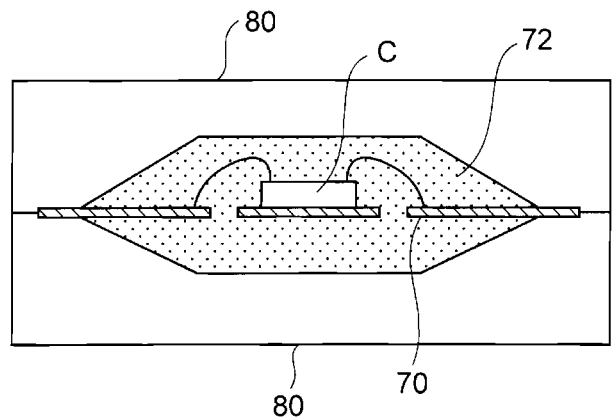

Next, the process goes to step S3. FIGS. 8A and 8B are cross-sectional views for explaining step S3.

As depicted in FIG. 8A, each semiconductor chip C is bonded on a die pad 70a of a lead frame 70 in this step. Then, tips of the lead frame 70 are wire-bonded to the bonding pad 60d (see FIG. 5) of the semiconductor chip C by use of a bonding wire 71 such as a gold wire.

Then, as depicted in FIG. 8B, the lead frame 70 and the semiconductor chip C are put into a die 80 which is preheated to a temperature in a range from about 150° C. to 200° C. Thereafter, a melted resin 72 is poured into the die 80 to seal the semiconductor chip C with the resin 72.

After the resin is sealed in this manner, the semiconductor chip C is taken out of the die 80 and is sent to step S4 in FIG. 6.

In step S4, in order to cure and completely cross-link the resin 72, the semiconductor chip C is put into the heat treatment apparatus 100, and the resin 72 is cured in such a condition that the silicon substrate 10 is heated to a temperature in a range from 200° C. to 250° C.

Subsequently, the process goes to step S5. In step S5, a final electrical test is performed for checking whether or not the resin-sealed semiconductor chip C operates normally. In this manner, the basic process according to this embodiment is completed.

In the embodiment described above, the heat treatment is carried out in steps S7, S9 and S4 which are indicated with a double line frame as depicted in FIG. 6. Next, a method of the heat treatment will be described.

Heat Treatment Method

Figure 9:
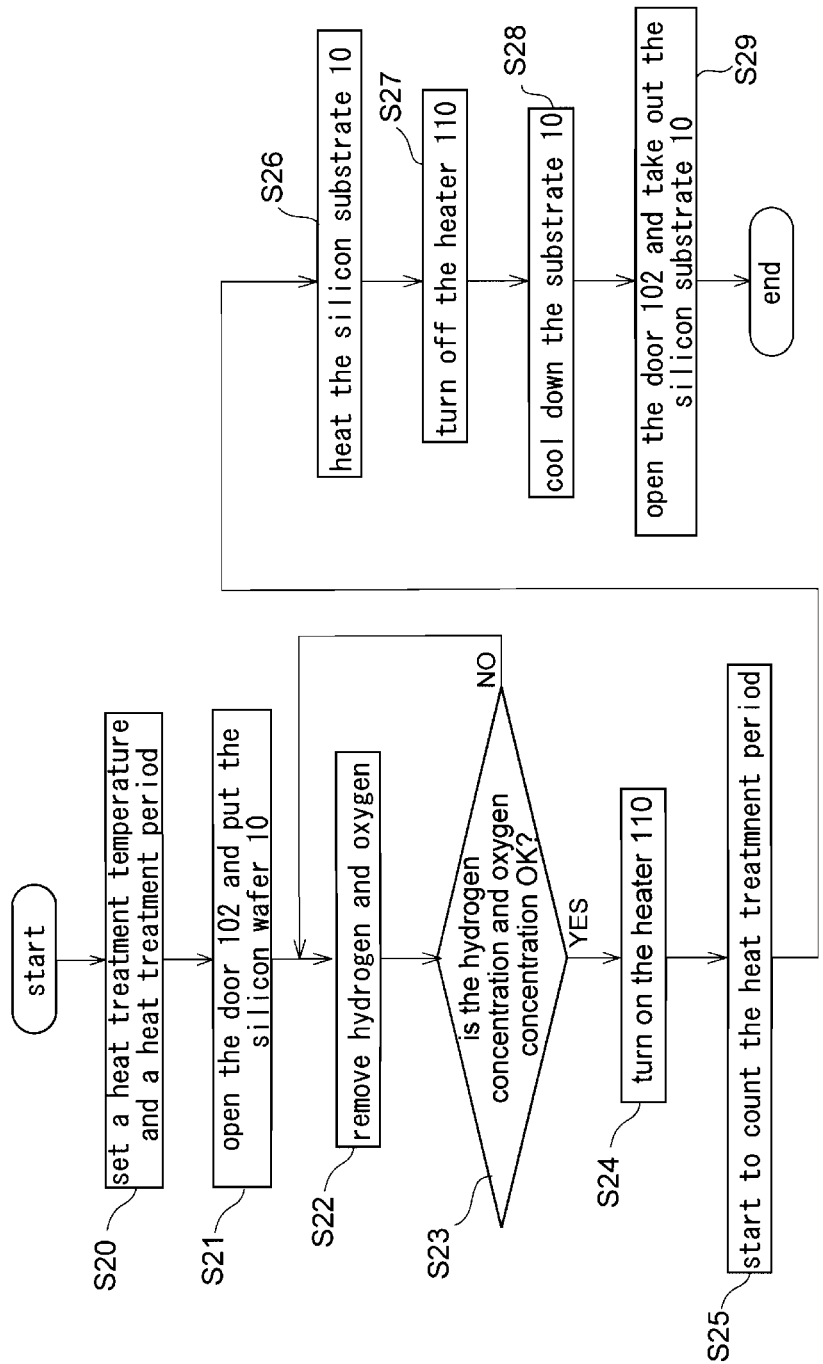
FIG. 9 is a flowchart depicting a heat treatment method in the first embodiment.

FIG. 9 is a flowchart depicting the heat treatment method using the heat treatment apparatus 100.

To perform a heat treatment, in step S20, a heat treatment temperature and a heat treatment period are firstly set by operating the control panel 103 (see FIG. 2).

Next, the process goes to step S21. In step S21, the door 102 is opened to put the silicon wafer 10 into the treatment chamber 101 together with the wafer cassette 105. Although up to four wafer cassettes 105 can be put into the treatment chamber 101 as described previously, step S21 may be started before the four wafer cassettes 105 are ready when the precedent process (steps S6, S8, S3, and the like) are protracted.

Here, when the heat treatment apparatus 100 is used in step S4, it is also possible to house the resin-sealed semiconductor chip C into a dedicated carrier and to put the carrier into the treatment chamber 101. This is also the case for a second embodiment to be described later.

Thereafter, the door 102 is closed to insulate the treatment chamber 101 from the outside air. Note that, at this stage, the heater 110 is set off and the inside of the treatment chamber 101 is not heated.

Next, the process goes to step S22. In step S22, the atmosphere in the treatment chamber 101 is circulated by the atmosphere adjustment mechanism 112 so as to selectively remove hydrogen and oxygen contained in the atmosphere with the hydrogen trap 114 and the oxygen trap 115, respectively. Thereby, the hydrogen concentration and oxygen concentration contained in the atmosphere is reduced to be lower than those in the air outside the apparatus 100.

Subsequently, the process goes to step S23. In step S23, it is determined whether or not the hydrogen concentration and oxygen concentration in the treatment chamber respectively become lower than predetermined values.

In this case, the predetermined value for the oxygen concentration is preferably 21% and more preferably 10%. On the contrary, the predetermined value for the hydrogen concentration is set to a concentration lower than that in the air (0.5 to 1.0 ppm) outside the apparatus, for example to 0.3 ppm.

This determination is made by letting operator check the measured values of the oxygen concentration meter 120 and the hydrogen concentration meter 121.

Figure 10:
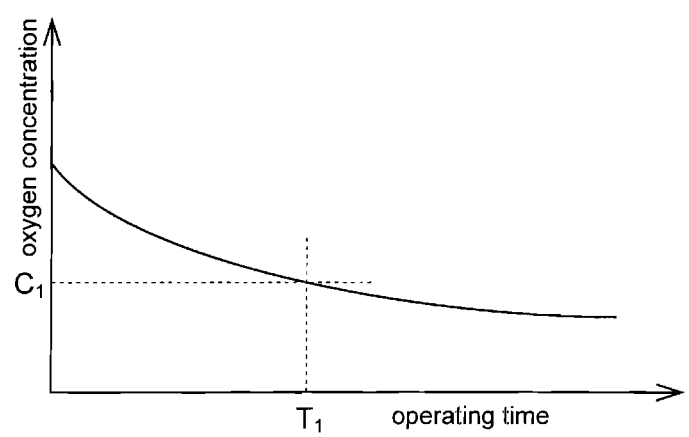
FIG. 10 is a view for explaining a method of obtaining oxygen concentration from operating time of an atmosphere adjustment mechanism in the respective embodiments.

Alternatively, as depicted in FIG. 10, a relation between operating time of the atmosphere adjustment mechanism 112 and the oxygen concentration in the chamber 101 may be investigated in advance. Then, based on this relationship, operating time $T_1$ of the atmosphere adjustment mechanism 112 necessary for reducing the oxygen concentration to less than a predetermined value $C_1$ (such as 10%) can be determined. Thus, when the operating time of the atmosphere adjustment mechanism 112 exceeds the value $T_1$, it can be determined that the oxygen concentration in the chamber 101 becomes lower than the predetermined value $C_1$. Note that the hydrogen concentration can also be determined in the same manner.

If it is determined in step 23 that the oxygen concentration and the hydrogen concentration are not reduced to less than the respective predetermined values (NO), the process waits until these concentrations are reduced.

By contrast, if these concentrations are determined to be below the respective predetermined values (YES), the process goes to step S24. In step S24, the heater 110 is turned on and heating of the silicon substrate 10 is thereby started.

By heating the silicon substrate 10 after the oxygen concentration is sufficiently reduced in this manner, it is possible to prevent the protection insulating film 68 (see FIG. 5), which is formed as an uppermost layer of the FeRAM and mainly composed of a novolac resin, from being deteriorated by oxygen.

For example, in steps S7 and S9 (see FIG. 6) in which heat treatments for aging are performed, unevenness is less likely to be formed on the upper surface of the protection insulating film 68 due to oxygen in comparison with the case of performing heat treatments in the air outside the apparatus 100.

Moreover, the amount of oxygen which enters an interface between the resin 72 and the chip C is reduced in step S4 in which a heat treatment for curing the sealing resin 72 is performed. This makes it possible to suppress formation of the unevenness on the upper surface of the protection insulating film 68 due to oxygen.

In addition, since the hydrogen concentration in the atmosphere is also reduced in these heat treatments, it is also possible to prevent the capacitor dielectric film 28a from being reduced and deteriorated by hydrogen in the steps S4, S7, and S9. Therefore, it is made possible to maintain ferroelectric characteristics of the capacitor dielectric film 28a, such as a residual polarization amount.

Subsequently, the process goes to step S25. In step S25, after the substrate temperature reaches the heat treatment temperature set in step S20, counting of the heat treatment period is started.

Thereafter, the process goes to step S26. In step S26, the silicon substrate 10 is heated to the heat treatment temperature set in step S20, while suppressing an excessive rise in the temperature in the treatment chamber 101 by introducing the cooling gas G into the treatment chamber 101 and slightly releasing the atmosphere in the treatment chamber 101 via the heat exhaust duct 111.

In this event, it is preferable to operate the air exhaust pump 130 so as to reduce the pressure in the treatment chamber 101 to slightly lower than the air pressure outside the apparatus 100. By heating the silicon substrate 10 under such reduced-pressure atmosphere, water in the first passivation film 65 made of silicon oxide is easily discharged to the outside and thus deterioration of the capacitor Q attributable to water can be prevented more easily.

Thereafter, when the counted time period reaches the predetermined period, i.e., the heat treatment period set in step S20, the process goes to step S27 to turn the heater 110 off.

Subsequently, the process goes to step S28. In step S28, the silicon substrate 10 is cooled down with the cooling gas G by introducing the cooling gas G into the treatment chamber 101.

The cooling gas G is introduced into the treatment chamber 101 through the hydrogen trap 114 and the oxygen trap 115. Accordingly, the amounts of hydrogen and oxygen contained in the gas G are reduced as compared to those in the air outside the apparatus 100. Hence, it is possible to prevent the silicon substrate 10 from being exposed to large amounts of hydrogen and oxygen in the cooling process.

Then, after the temperature of the silicon substrate 10 decreases to a temperature at which the protection insulating film 68 is not deteriorated even by being exposed to oxygen, for example, to a temperature equal to or below 100° C., the process goes to step S29. In step S29, the door 102 is opened to take the silicon substrate 10 out of the treatment chamber 101.

In this way, the basic steps of the heat treatment method using the heat treatment apparatus 100 are completed.

According to the above-described heat treatment method, the heating of the silicon substrate 10 is started after the oxygen concentration in the atmosphere of the chamber 101 is reduced to less than the predetermined value in step S24. Hence it is possible to prevent the protection insulating film 68, which is formed as the uppermost layer over the silicon substrate 10 and mainly composed of a novolac resin, from being deteriorated by oxygen. This makes it possible to improve long-term reliability of the protection insulating film 68 and to prevent detachment of the resin 72 (see FIG. 8B) attributable to deterioration of the protection insulating film 68, thereby improving reliability of a semiconductor device such as a FeRAM.

In particular, the deterioration of the protection insulating film 68 containing a novolac resin becomes significant at a temperature equal to or above 100° C. Therefore, by applying the above-described heat treatment method to the steps S7, S9, and S4 (see FIG. 6) which are executed at a substrate temperature equal to or above 100° C., it is possible to efficiently prevent deterioration of the protection insulating film 68 in these steps.

Moreover, the hydrogen concentration of the atmosphere in the chamber 101 during the heat treatment is also reduced. This makes it possible to prevent the capacitor dielectric film 28a from being reduced and deteriorated by hydrogen having a reduction effect. Thus, it is made possible to maintain the characteristics of the ferroelectric capacitor Q.

In addition, the oxygen concentration and hydrogen concentration of the cooling gas G are reduced as compared to those in the air outside the chamber by use of the hydrogen trap 114 and the oxygen trap 115 when the silicon substrate 10 is cooled in step S28. This makes it possible to prevent deterioration of the protection insulating film 68 attributable to oxygen and to prevent reduction of the capacitor dielectric film 28a attributable to hydrogen.

(Second Embodiment)

Next, a second embodiment will be described.

Figure 11:
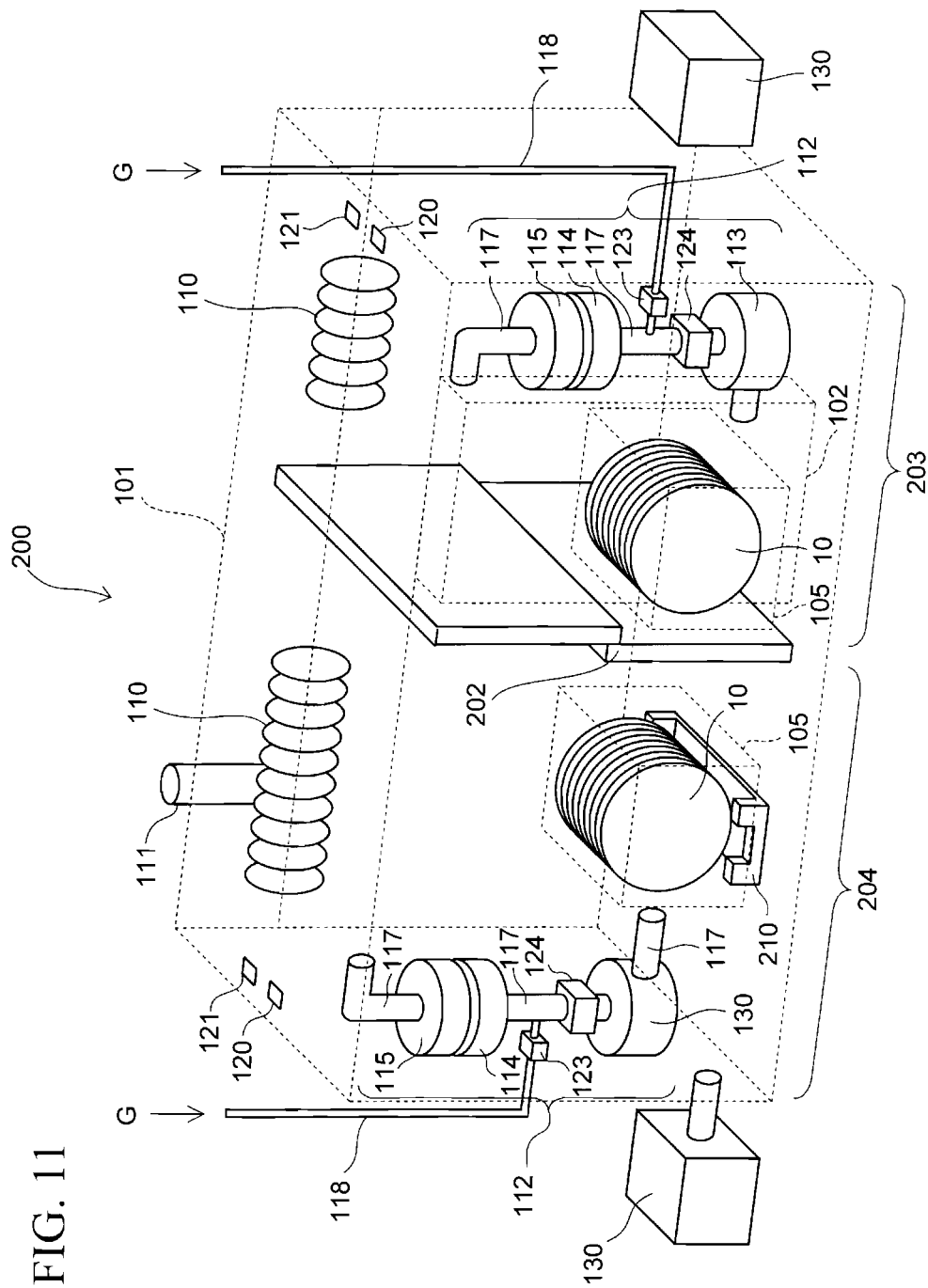
FIG. 11 is a perspective view depicting a detailed structure of a heat treatment apparatus used in a second embodiment.

FIG. 11 is a perspective view depicting a detailed structure of a heat treatment apparatus used in this embodiment. In FIG. 11, the same constituents as those described with reference to FIG. 4 will be denoted by the same reference numerals as those in FIG. 4 and a duplicate explanation will be omitted below.

In a heat treatment apparatus 200 according to this embodiment, a partition wall 202 which is vertically openable and closable partitions the treatment chamber 101 into a first treatment chamber 203 located next to the door 102 and a second treatment chamber 204 located farther from the door 102.

Of these chambers, the second treatment chamber 204 is provided with the heat exhaust duct 111 configured to release heat in the second treatment chamber 204 to the outside.

Although volumes of the respective treatment chambers 203 and 204 are not particularly limited, it is preferable to design the volume of the first treatment chamber 203 smaller than that of the second treatment chamber 204. In this embodiment, the number of wafer cassettes 105 that can be housed in the first treatment chamber 203 is set to one or two, for example one. On the other hand, the number of wafer cassettes 105 that can be housed in the second treatment chamber 204 is set to four.

Note that, in FIG. 11, only one wafer cassette 105 is disposed in the second treatment chamber 204 in order to avoid complication of the drawing.

Moreover, the heater 110, the atmosphere adjustment mechanism 112, and the air exhaust pump 130 described above are provided in each of the first and second treatment chambers 203 and 204.

The heating temperatures in the respective treatment chambers 203 and 204 with the heaters 110 are set through the unillustrated control panel provided on the front face of the heat treatment apparatus 200.

Further, a transfer robot 210 for transferring the wafer cassettes 105 between the treatment chambers 203 and 204 is disposed in the heat treatment apparatus 200.

In this embodiment, the heater 110 in the second treatment chamber 204 is always set to on and the temperature in the second treatment chamber 204 is always maintained at the temperature set through the control panel. Moreover, the circulating fan 113 of the atmosphere adjustment mechanism 112 provided in the second treatment chamber 204 always operates, whereby oxygen and hydrogen contained in an atmosphere in the second treatment chamber 204 are always reduced as compared to those in the air outside the apparatus 200.

On the other hand, the first treatment chamber 203, which allows inflow of air by opening and closing actions of the door 102, functions as a buffer chamber for preventing inflow of a large amount of air into the second treatment chamber 204. When the door 102 is open, the heater 110 and atmosphere adjustment mechanism 112 in the first treatment chamber 203 do not operate.

Moreover, the oxygen concentration meter 120 and the hydrogen concentration meter 121 are provided in each of the first and second treatment chambers 203 and 204. These concentration meters enable individual measurement of the oxygen concentration and hydrogen concentration in each of the treatment chambers 203 and 204.

This heat treatment apparatus 200 is used in steps S7, S9, and S4 for performing the heat treatments as previously described with reference to FIG. 6. Now, a heat treatment method using the heat treatment apparatus 200 will be described blow.

Figure 12:
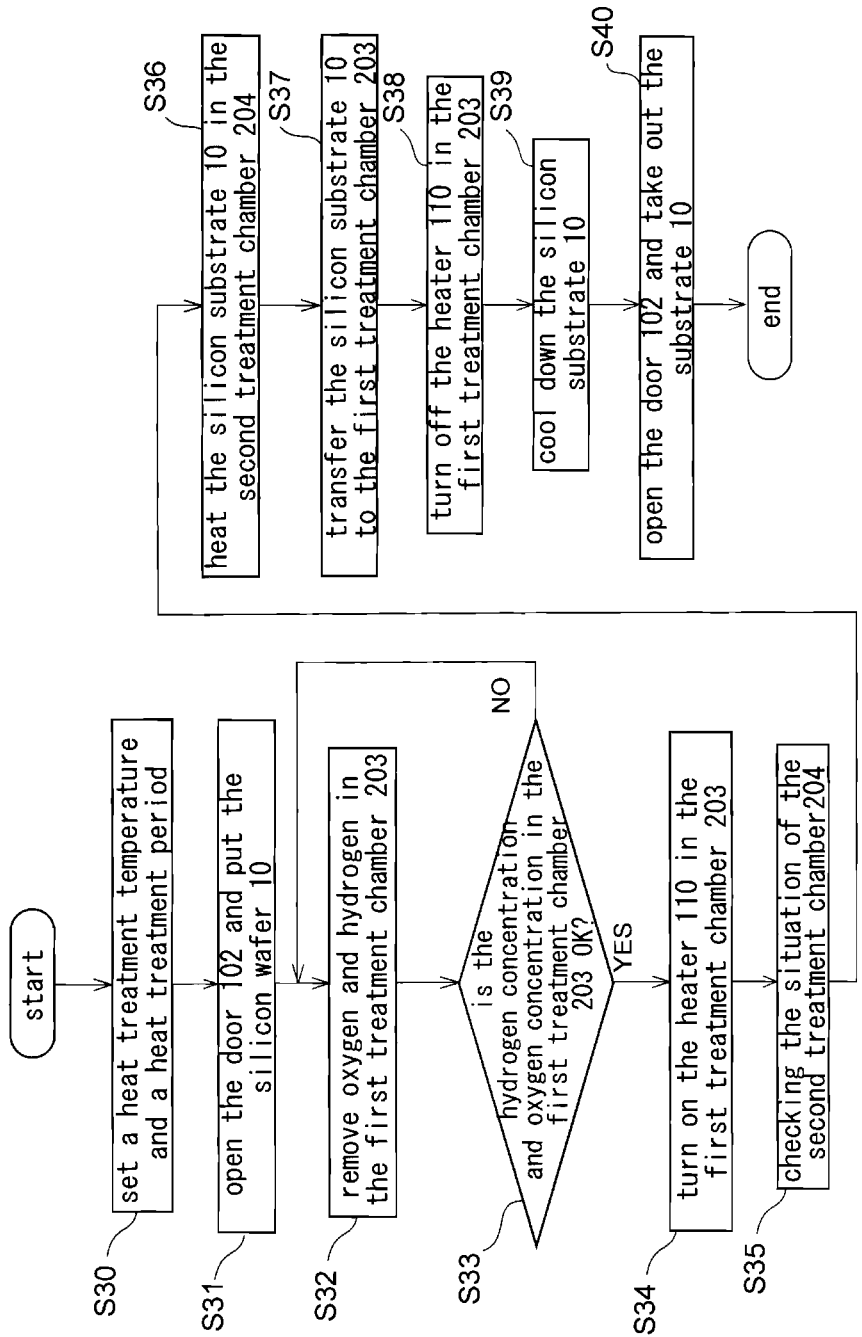
FIG. 12 is a flowchart depicting a heat treatment method in the second embodiment.

FIG. 12 is a flowchart depicting the heat treatment method according to this embodiment.

To perform a heat treatment, the heat treatment temperature and heat treatment period are firstly set in step S30 by operating the control panel.

With this setting, in the second treatment chamber 204, the amount of current supplied to the heater 110 which is always set to on is controlled, and the substrate temperature is adjusted to the above-mentioned heat treatment temperature.

Subsequently, the process goes to step S31. In step S31, the door 102 is opened and the single wafer cassette 105 containing one lot (25 sheets) of the silicon substrates 10 is put into the first treatment chamber 203. As described previously, the heater 110 in the first treatment chamber 203 is set to off when the door 102 is open.

Then, the door 102 is closed.

Subsequently, the process goes to step S32. In step S32, the atmosphere adjustment mechanism 112 in the first treatment chamber 203 is operated to reduce the concentrations of oxygen and hydrogen contained in the atmosphere in the first treatment chamber 203 to less than the respective concentrations in the air outside the apparatus 200.

Subsequently, the process goes to step S33 to determine whether or not the hydrogen concentration and oxygen concentration in the first treatment chamber 203 respectively become lower than predetermined values.

Similar to the first embodiment, the predetermined value for the oxygen concentration is preferably 21% and more preferably 10%. Meanwhile, the predetermined value for the hydrogen concentration is set to 0.3 ppm, for example.

This determination is made by letting an operator check the measured value of the oxygen concentration meter 120 and the hydrogen concentration meter 121.

Alternatively, as described in the first embodiment with reference to FIG. 10, it is also possible to determine that the oxygen concentration becomes lower than a predetermined value (such as 10%) when the operating time of the atmosphere adjustment mechanism 112 exceeds the value $T_1$ which is necessary for reducing the oxygen concentration to less than the predetermined value. The hydrogen concentration can also be determined in the same manner.

When it is determined that the oxygen concentration and the hydrogen concentration are not reduced to less than the respective predetermined values (NO), the process waits until these concentrations are reduced.

By contrast, when these concentrations are determined to be below the respective predetermined values (YES), the process goes to step S34. In step S34, the heater 110 is turned on and heating of the silicon substrate 10 in the first treatment chamber 203 is thereby started.

In step S34, the silicon substrate 10 is heated until the substrate temperature reaches the heat treatment temperature set in step S30. Here, it is also preferable to operate the air exhaust pump 130 provided in the first treatment chamber 203 to reduce the pressure in the first treatment chamber 203 so that water in the first passivation film 65 made of silicon oxide can be easily discharged to the outside.

Then, the process goes to step S35 when the substrate temperature reaches the above-described heat treatment temperature.

In this step, it is checked whether or not the oxygen concentration and hydrogen concentration of the atmosphere in the second treatment chamber 204 are below the predetermined values respectively based on the values measured by using the oxygen concentration meter 120 and the hydrogen concentration meter 121 provided in the second treatment chamber 204. Note that the predetermined values are set similarly to those in the first treatment chamber 203, which are 10% for the oxygen concentration and 0.3 ppm for the hydrogen concentration.

Moreover, in this step, it is also checked whether or not the temperature in the second treatment chamber 204 is equal to the heat treatment temperature set in step S30.

Then, when it is confirmed that there are no problems in the temperature, the oxygen concentration, and the hydrogen concentration in the second treatment chamber 204, the partition wall 202 is opened, and the transfer robot 210 transfers the wafer cassette 105 to the second treatment chamber 204.

When the transfer is completed, the partition wall 202 is closed again and the atmosphere in the second treatment chamber 204 is insulated from the first treatment chamber 203.

Subsequently, the process goes to step S36. In step S36, the open-close valve 123 of the atmosphere adjustment mechanism 112, which is always in an operating state in the second treatment chamber 204, is opened to slightly take in the cooling gas G into the second treatment chamber 204. At the same time, the atmosphere in the second treatment chamber 204 is slightly released via the heat exhaust duct 111. Thereby, the silicon substrate 10 is heated in the second treatment chamber 204 while suppressing an excessive rise in the temperature in the second treatment chamber 204.

In this case, similar to the first embodiment, in order to prevent deterioration of the capacitor Q attributable to water, it is also preferable to operate the air exhaust pump 130 provided in the second treatment chamber 204 so as to slightly reduce the pressure in the second treatment chamber 204, and thereby to release water in the first passivation film 65 made of silicon oxide to the outside.

Next, the process goes to step S37, when a sum of the time periods spent for heating the silicon substrate 10 respectively in the first treatment chamber 203 and the second treatment chamber 204 reaches the heat treatment period set in step S30.

In step S37, the partition wall 202 is opened and the transfer robot 210 transfers the wafer cassette 105 to the first treatment chamber 203.

Subsequently, the process goes to step S38. In step S38, the heater 110 in the first treatment chamber 203 is turned off.

Then, the process goes to step S39. In step S39, the cooling gas G of room temperature is introduced into the first treatment chamber 203 to cool the silicon substrate 10 with the cooling gas G.

Here, when the pressure in the first treatment chamber 203 is reduced in step S34, the pressure in the first treatment chamber 203 is put back to the atmospheric pressure with this cooling gas G.

Then, after the temperature of the silicon substrate 10 decreases to a temperature at which the protection insulating film 68 is not deteriorated even by being exposed to oxygen, for example, to a temperature equal to or below 100° C., the process goes to step S40. In step S40, the door 102 is opened to take the silicon substrate 10 out of the first treatment chamber 203.

In this way, the basic steps of the heat treatment method using the heat treatment apparatus 200 are completed.

According to the above-described embodiment, the oxygen concentration and hydrogen concentration of each of the first and second treatment chambers 203 and 204 are reduced as compared to the respective concentrations in the air outside the apparatus 200 by use of the atmosphere adjustment mechanisms 112 provided in the respective treatment chambers 203 and 204. Therefore, similar to the first embodiment, it is possible to suppress the unevenness of the surface of the protection insulating film 68 originate from being exposed to oxygen in the heating atmosphere. Moreover, it is made possible to suppress the deterioration of the capacitor dielectric film 28a originate from hydrogen.

Moreover, since the treatment chamber 101 is divided into the first and second treatment chambers 203 and 204, throughput of the heat treatment apparatus 200 can be more improved than that in the first embodiment due to the following reasons.

Figure 13:
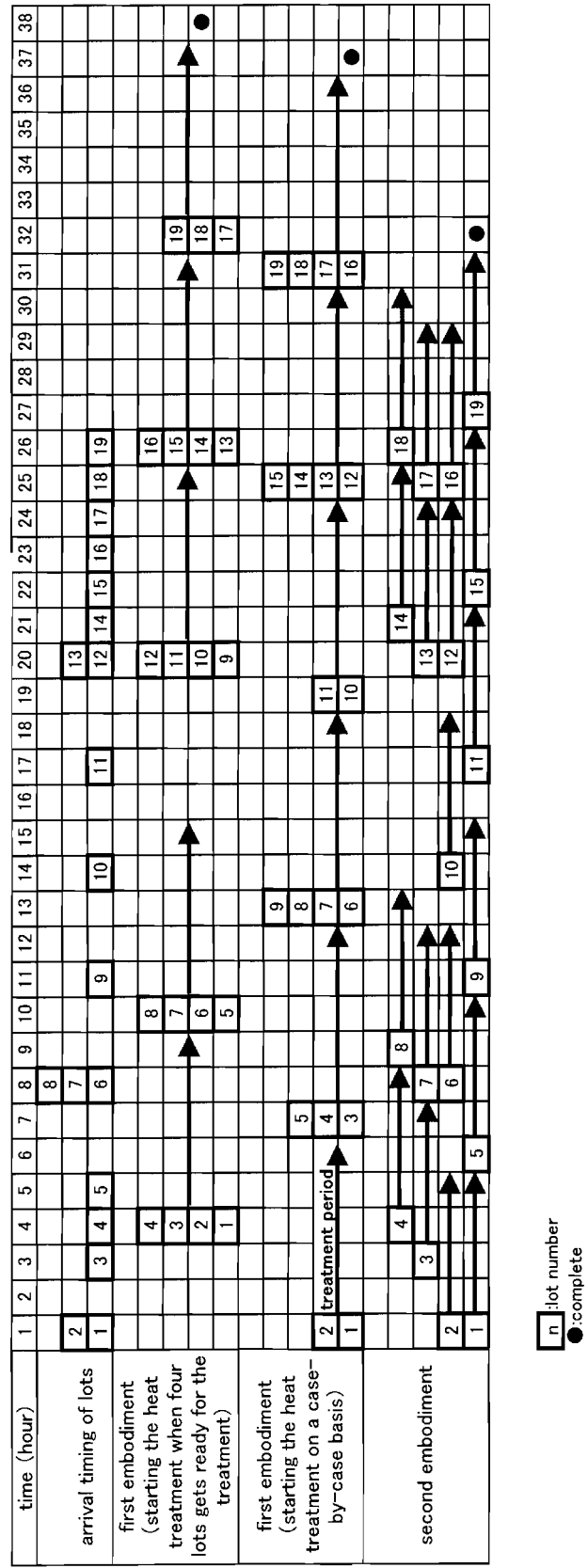
FIG. 13 is a schematic diagram for explaining improvement of throughput achieved by the heat treatment apparatus in the second embodiment.

FIG. 13 is a schematic diagram for explaining improvement of throughput achieved by the heat treatment apparatus 200.

The example depicted in FIG. 13 assumes the case where 19 lots are put into the heat treatment apparatus 200 in accordance with the illustrated timing. Moreover, the heat treatment period for each lot is 4 hours.

There are two methods available in the case of performing the heat treatments by using the single treatment chamber 101 as described in the first embodiment. Namely, one method is to start the heat treatment when the maximum number of lots (4 lots) gets ready for the treatment in the treatment chamber 101. The other method is to start the heat treatment on a case-by-case basis without waiting for subsequent lots.

Any of these methods requires about an extra one hour in total for raising the temperature before the heat treatment and for decreasing the temperature after the heat treatment. Therefore, the length of each arrow (i.e., the treatment period) in the drawing becomes 5 hours (=4 hours+1 hour).

As illustrated in the drawing, in order to complete the treatments on the entire 19 lots in the first embodiment, the former method requires 37 hours, and the latter method requires 36 hours.

On the other hand, when the treatment chamber 101 is divided into the first and second treatment chambers 203 and 204 as in the second embodiment, the temperature of the atmosphere in the second treatment chamber 203 is maintained at a constant temperature as described previously. Therefore, only the first treatment chamber 203 requires raising the temperature and decreasing the temperature.

Moreover, the volume of the first treatment chamber 203 is smaller than that of the second treatment chamber 204. Namely, the volume of the first treatment chamber 203 is as large as a size for housing just one lot. Accordingly, it is possible to control the temperature of the atmosphere in the first treatment chamber 203 rapidly, and thus only 10 minutes suffices as a sum of the period for warming up and cooling down the chamber 203. For this reason, the length of an arrow (i.e., the treatment period) in the drawing becomes about 4 hours, which is substantially equal to the heat treatment period.

As a result, present embodiment requires only 31 hours in order to complete the treatments on the entire 19 lots. Therefore, present embodiment enables treatments of multiple lots with a shorter time period than that required in the first embodiment.

In this way, present embodiment makes it possible to improve the throughput of the heat treatment apparatus 200 and thus to reduce manufacturing costs of semiconductor devices.

(Third Embodiment)

In this embodiment, a description will be given of details of a method of manufacturing the FeRAM depicted in FIG. 5 which includes the protection insulating film containing a novolac resin as the uppermost layer.

Figure 14A:
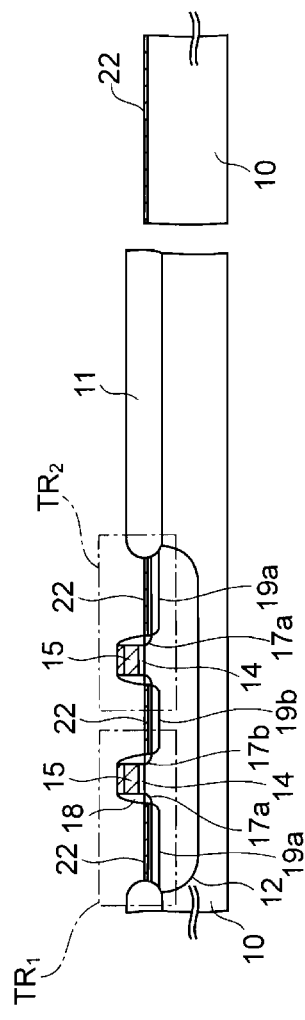
FIGS. 14A to 14Z and FIG. 15 are cross-sectional views depicting processes of manufacturing a FeRAM according to a third embodiment.
Figure 14B:
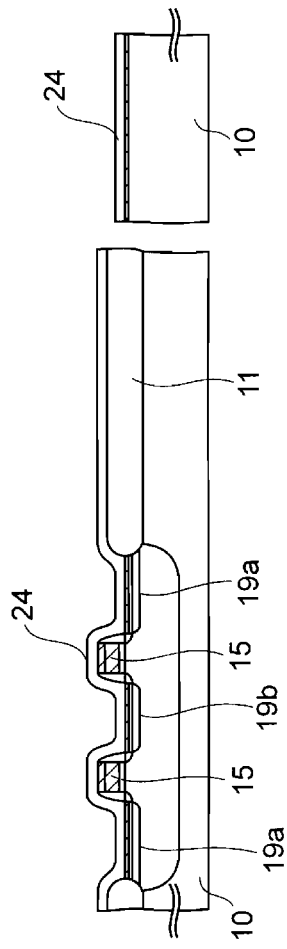
Figure 14C:
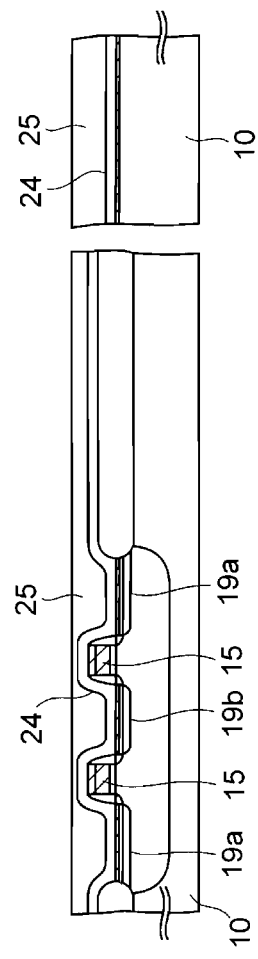
Figure 14D:
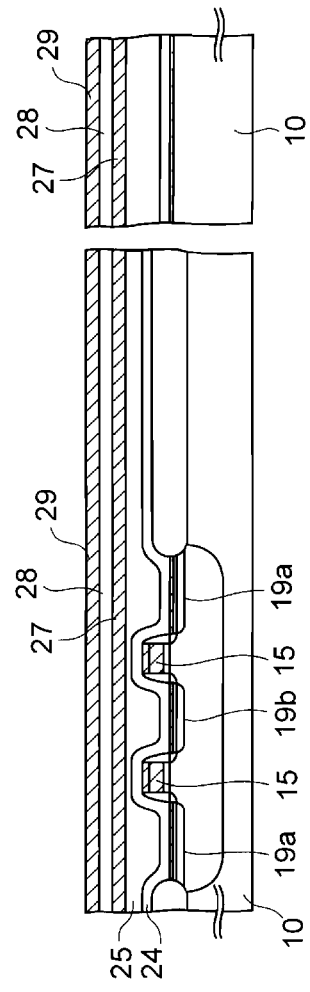
Figure 14E:
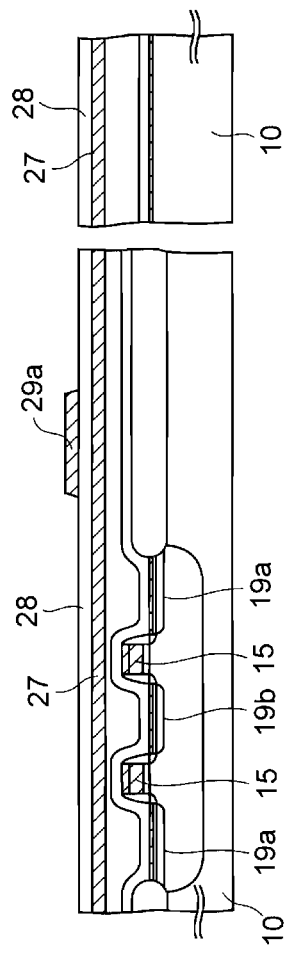
Figure 14F:
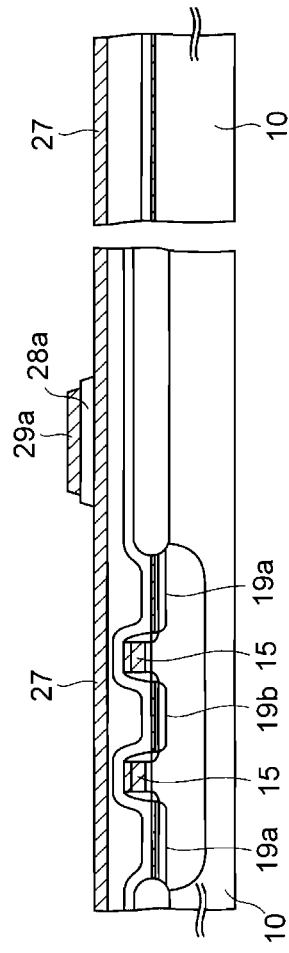
Figure 14G:
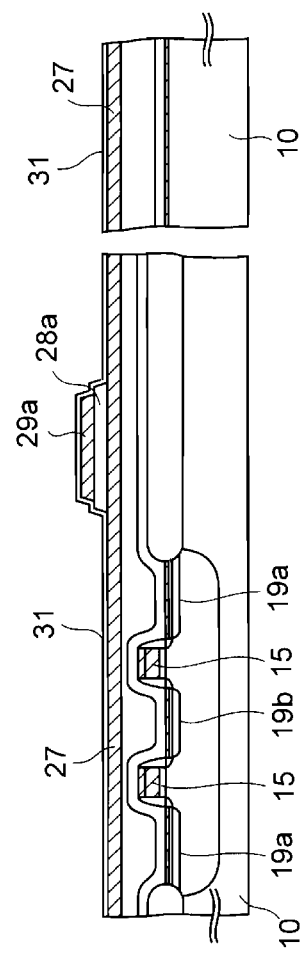
Figure 14H:
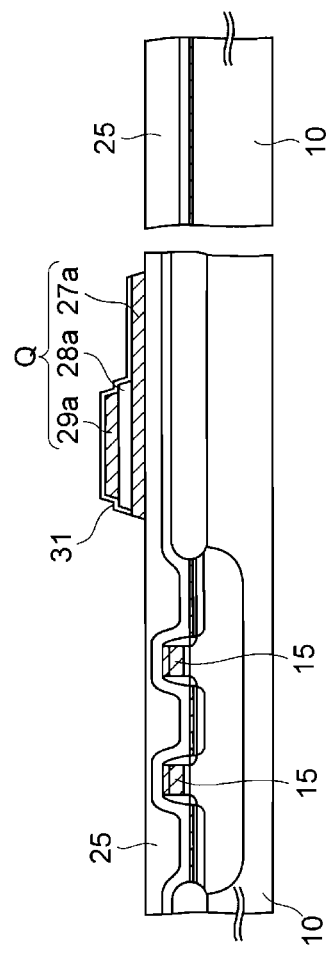
Figure 14I:
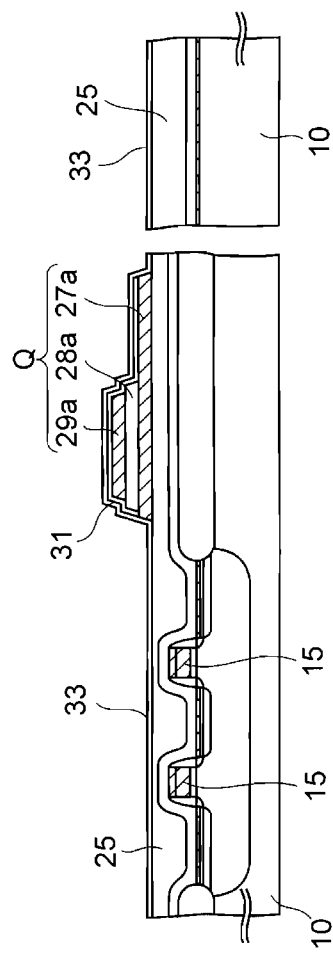
Figure 14J:
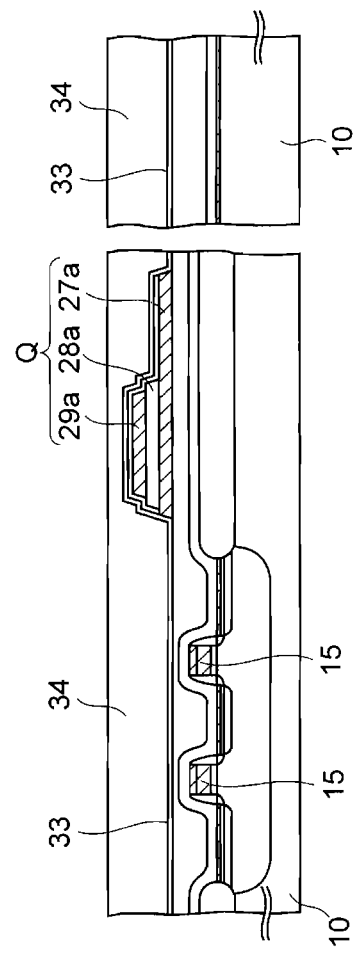
Figure 14K:
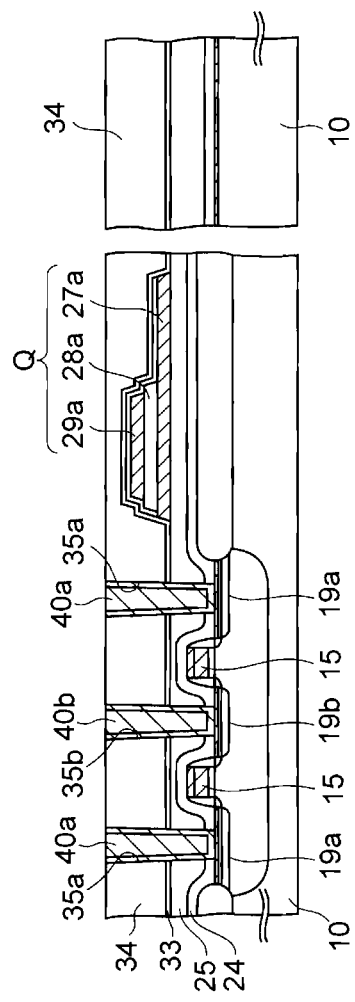
Figure 14L:
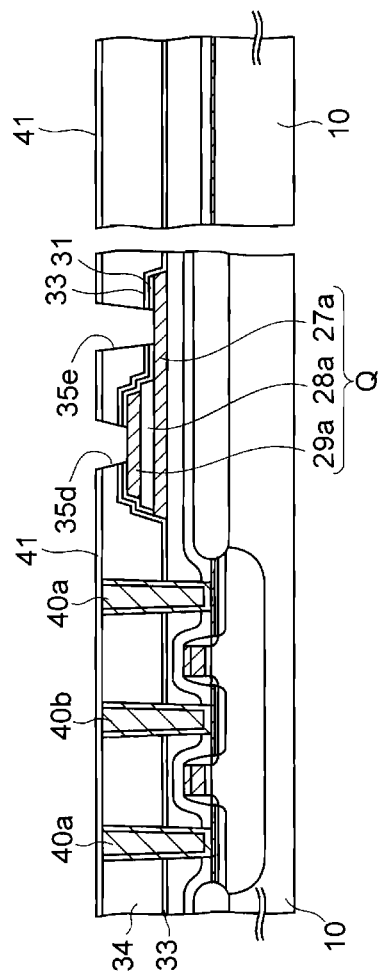
Figure 14M:
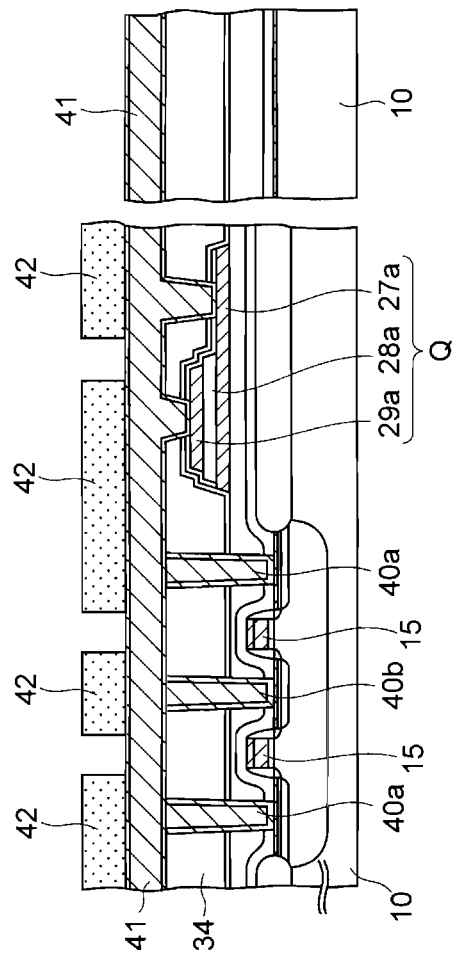
Figure 14N:
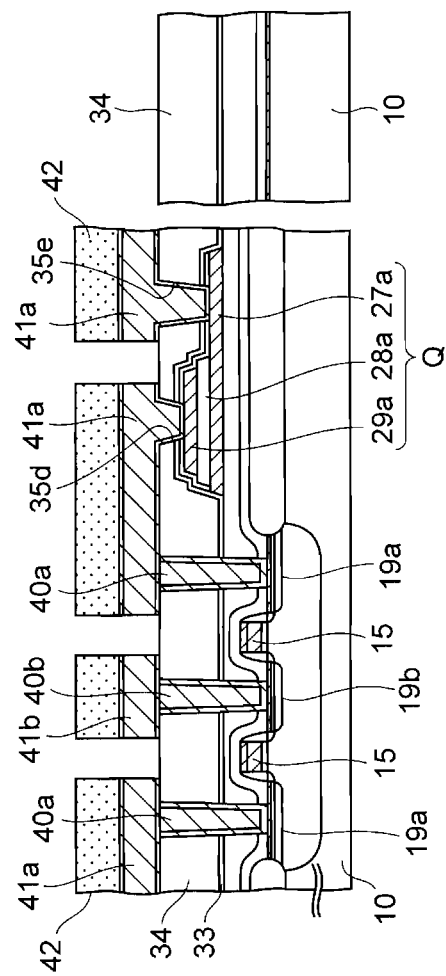
Figure 14O:
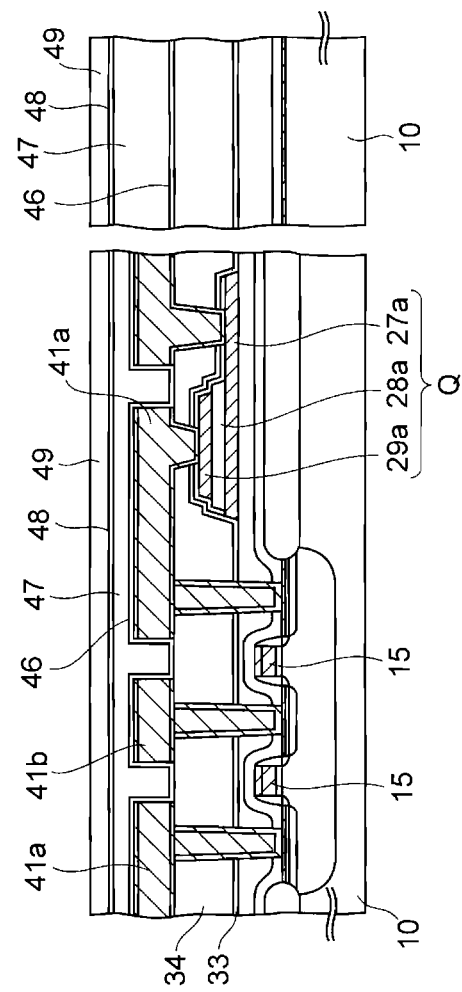
Figure 14P:
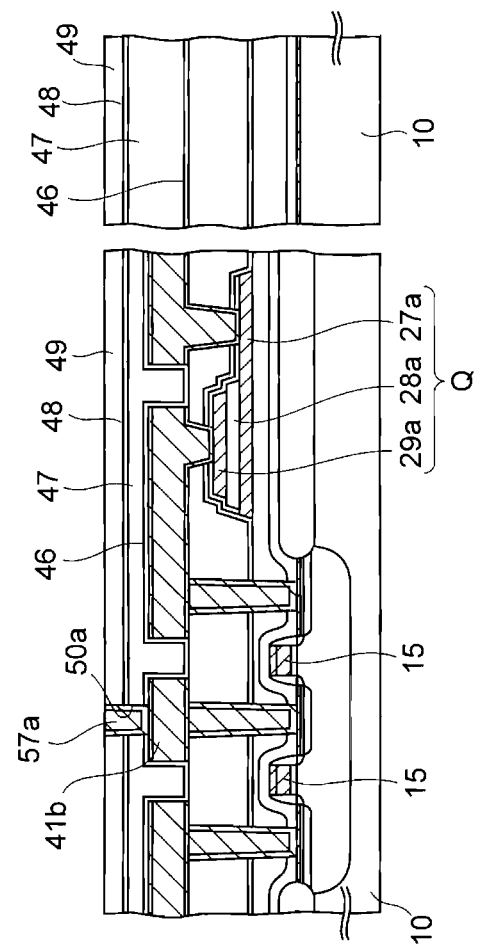
Figure 14Q:
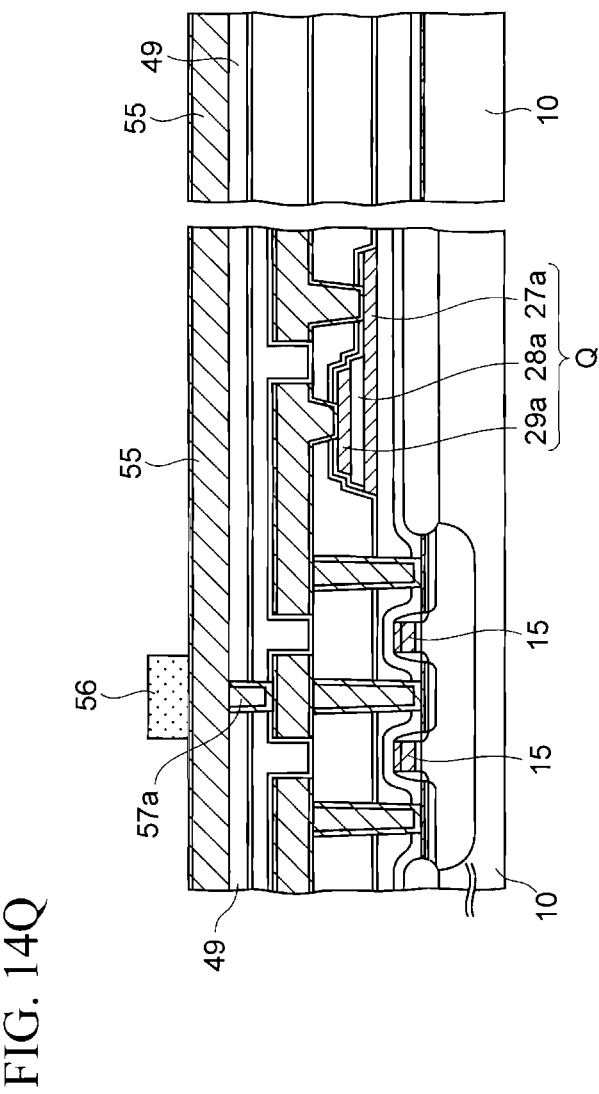
Figure 14R:
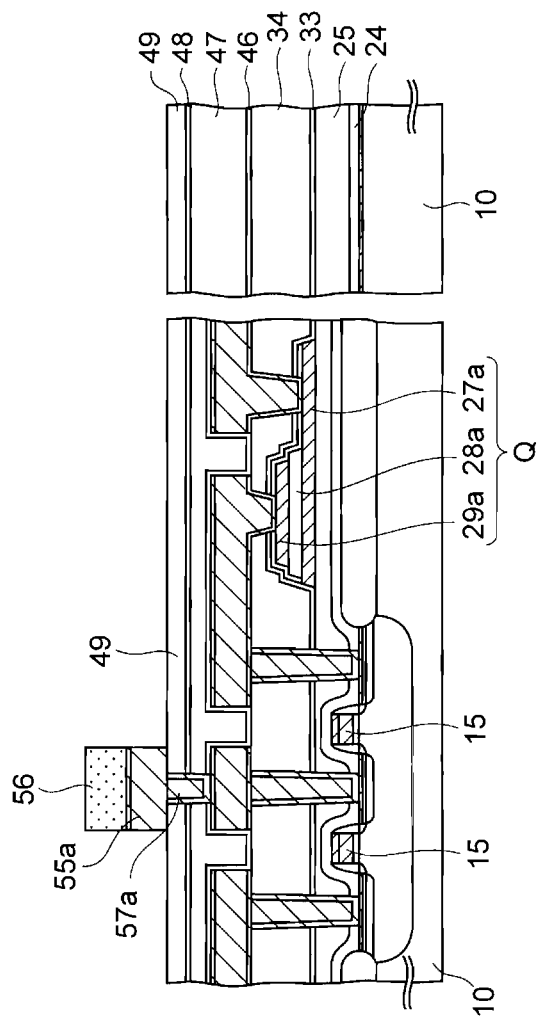
Figure 14S:
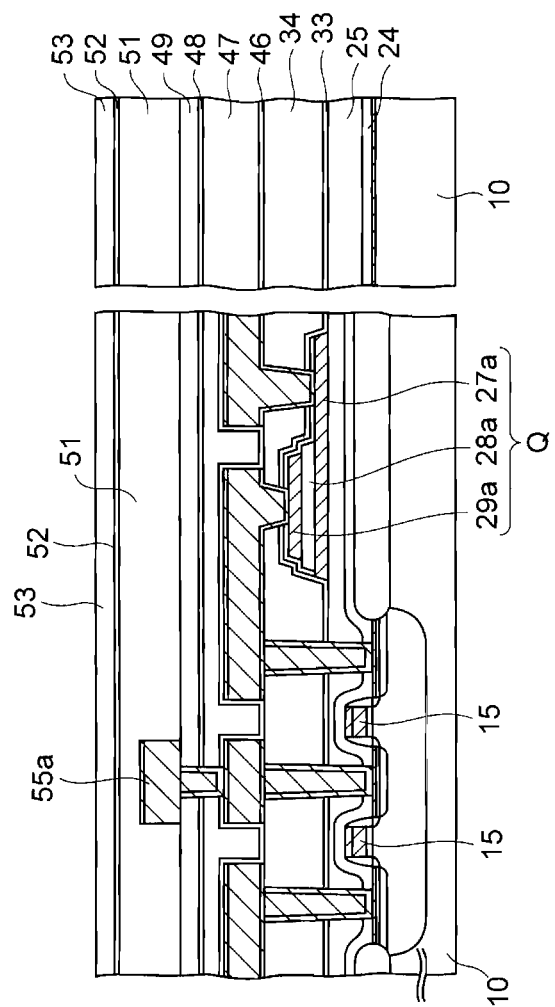
Figure 14T:
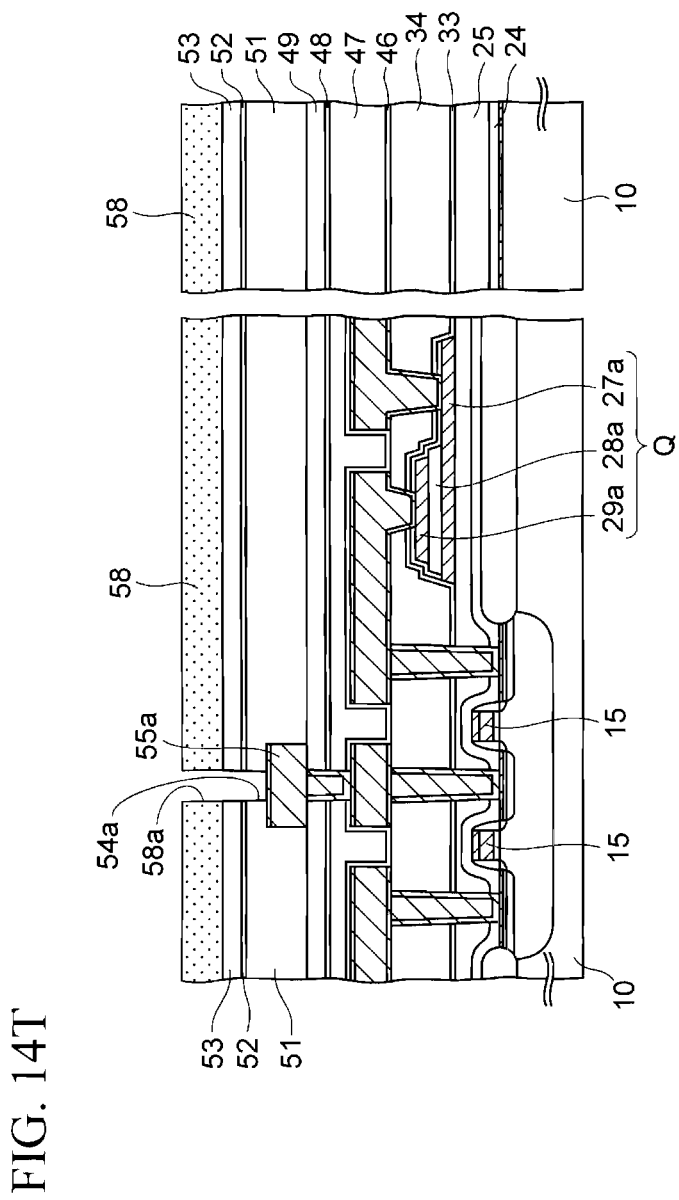
Figure 14U:
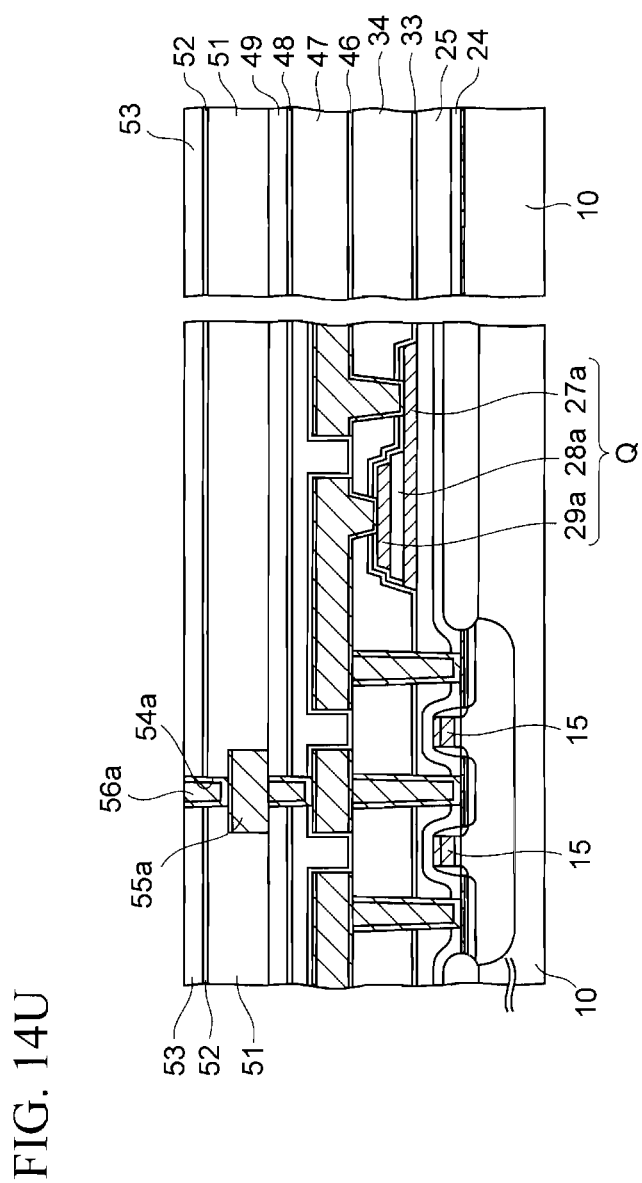
Figure 14V:
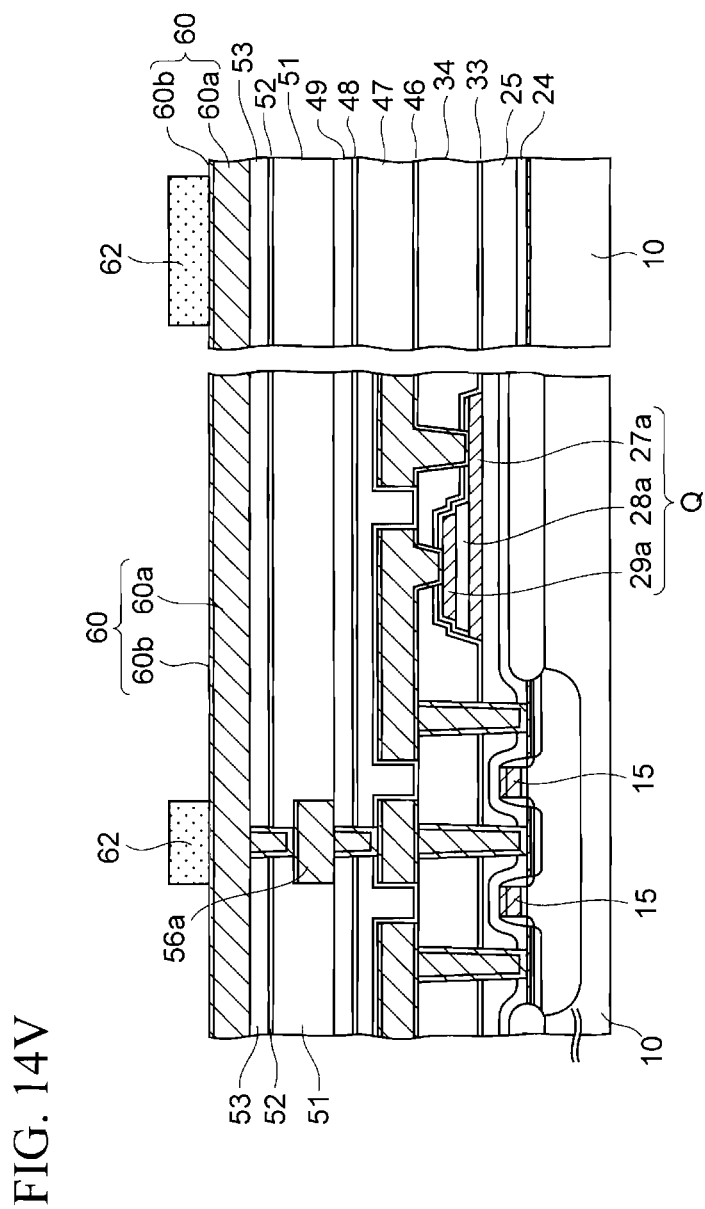
Figure 14W:
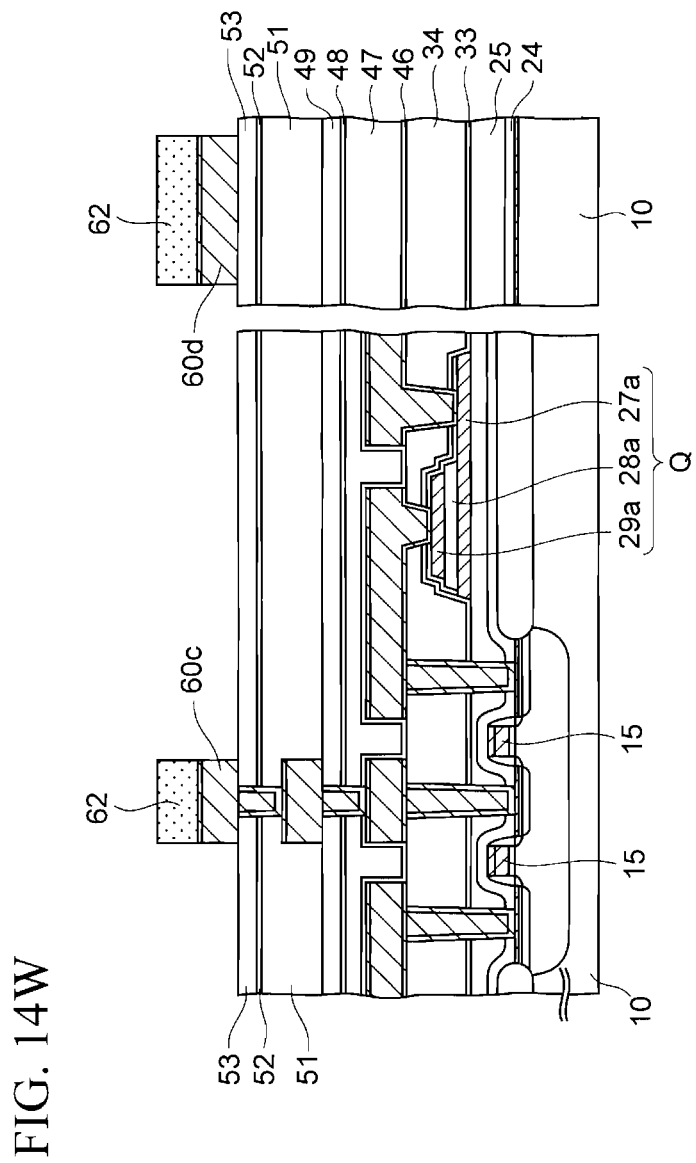
Figure 14X:
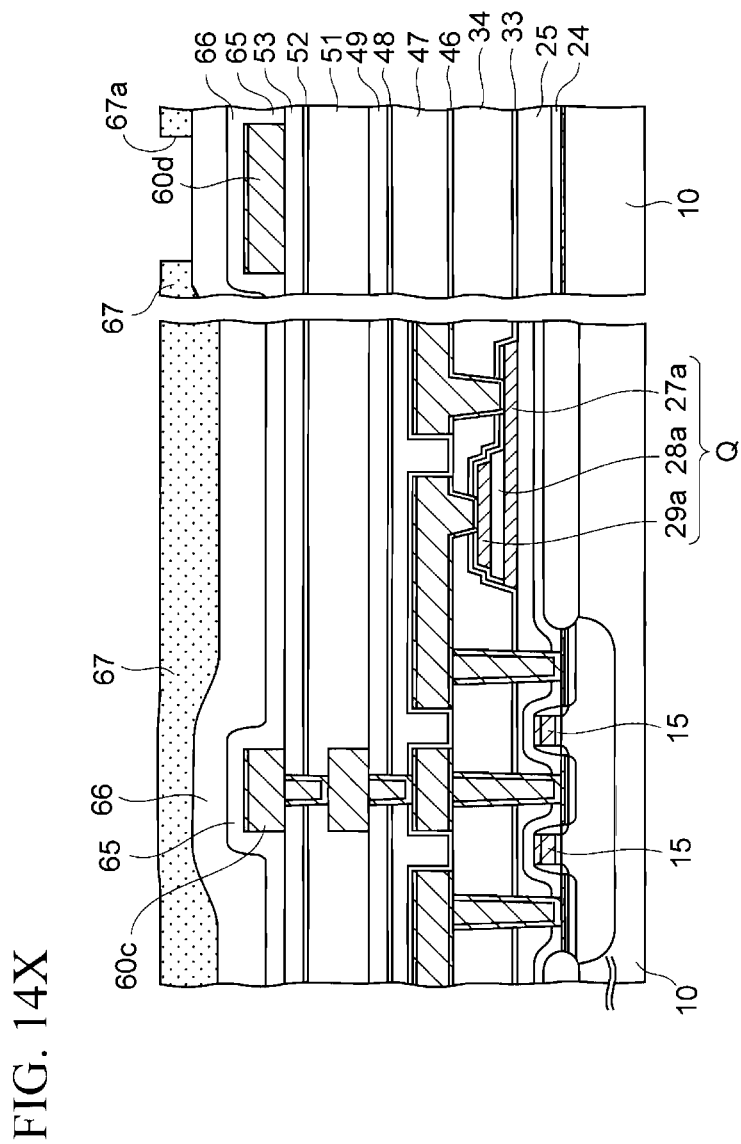
Figure 14Y:
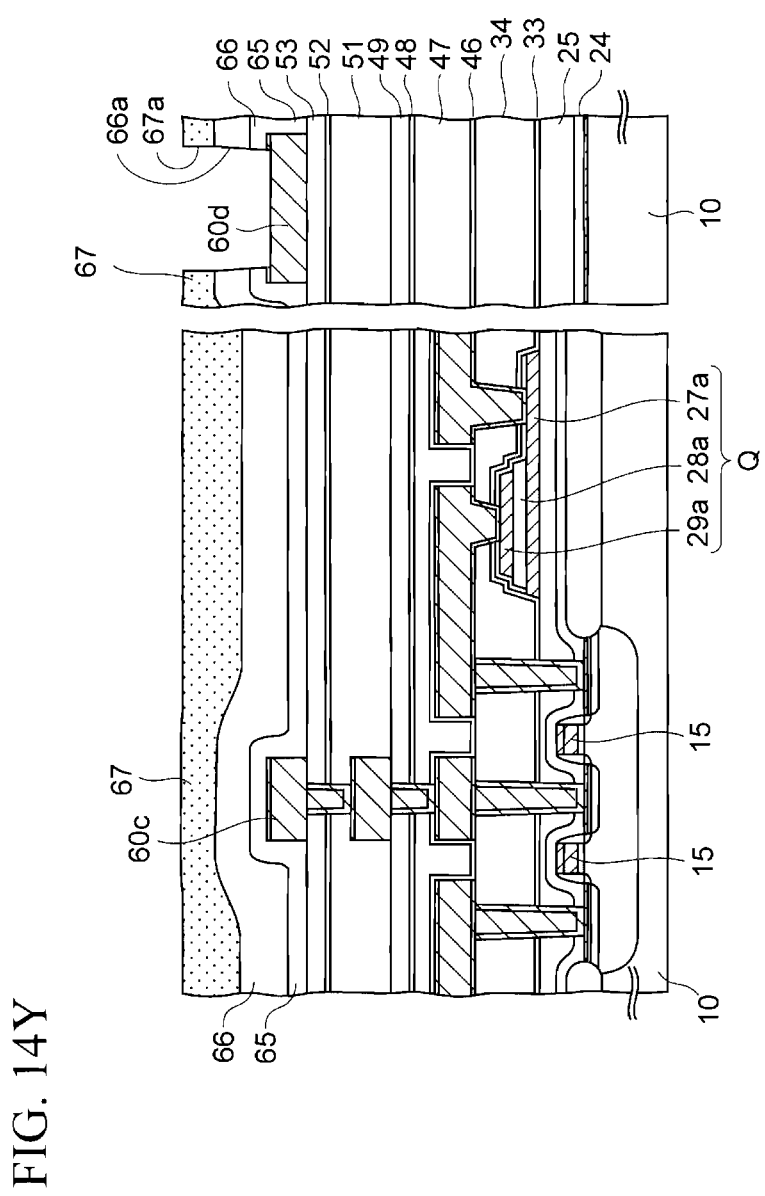
Figure 14Z:
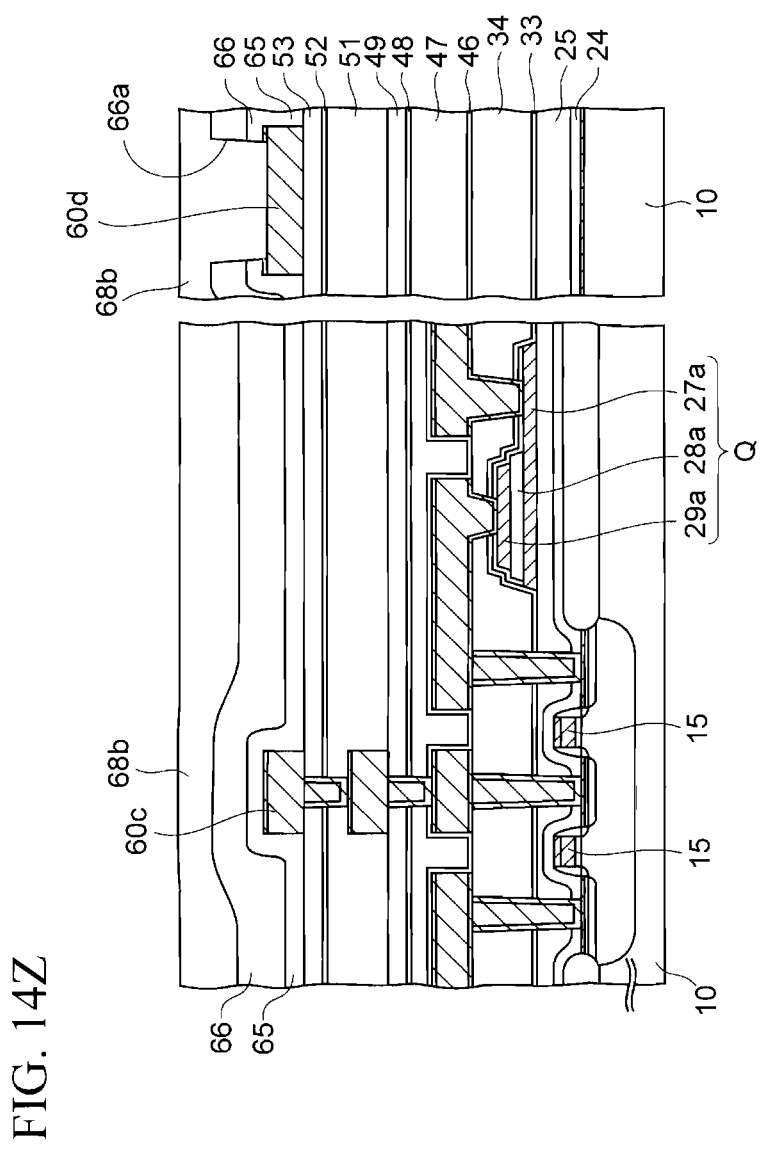
Figure 15:
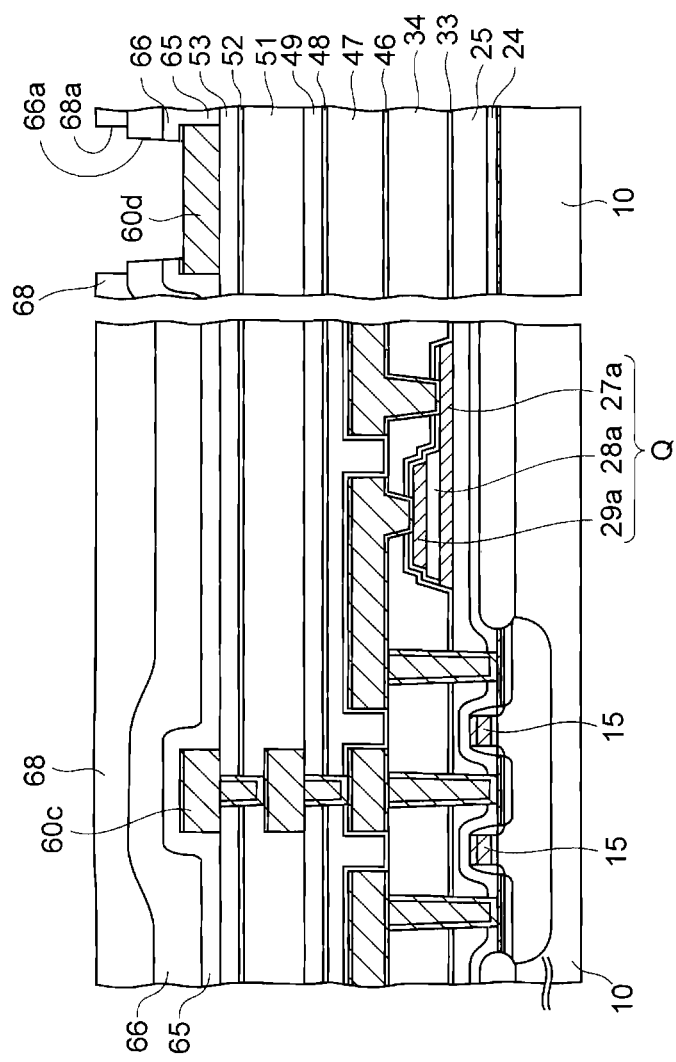

FIGS. 14A to 14Z and FIG. 15 are cross-sectional views depicting processes of manufacturing the FeRAM according to this embodiment.

Firstly, steps to obtain a cross-sectional structure depicted in FIG. 14A will be described.

First, an element isolation insulating film 11 is formed by thermally oxidizing a surface of the silicon (semiconductor) substrate 10 either of an n-type or a p-type, and an active region of each transistor is defined by this element isolation insulating film 11. Such an element isolation structure is called LOCOS (local oxidation of silicon). Instead, STI (shallow trench isolation) may also be applied.

Next, a p-type impurity such as boron is introduced into the active region of the silicon substrate 10 to form a p-well 12. Then, a thermally-oxidized film serving as a gate insulating film 14 is formed in a thickness of about 6 nm to 7 nm by thermally oxidizing a surface of the active region.

Subsequently, an amorphous silicon film with a thickness of about 50 nm and a tungsten silicide film with a thickness of about 150 nm are sequentially formed on an entire upper surface of the silicon substrate 10. Here, a polycrystalline silicon film may be formed instead of the amorphous silicon film. Thereafter, these films are patterned by photolithography to form gate electrodes 15 on the silicon substrate 10.

The two gate electrodes 15 are formed in parallel to each other on the p-well 12, each of which constitutes a part of a word line.

Moreover, phosphorus functioning as an n-type impurity is introduced into the silicon substrate 10 at portions beside the gate electrodes 15 by means of ion implantation with the gate electrodes 15 being used as a mask, thereby forming first and second source/drain extensions 17a and 17b.

Thereafter, an insulating film is formed on the entire upper surface of the silicon substrate 10. The insulating film is then etched back and left beside the gate electrodes 15 as insulating spacers 18. As the insulating film, a silicon oxide film is formed by a CVD (chemical vapor deposition) method, for example.

Subsequently, first and second source/drain regions 19a and 19b are formed in the silicon substrate 10 at portions beside the gate electrodes 15 by ion implanting an n-type impurity such as arsenic into the silicon substrate 10 while using the insulating spacers 18 and the gate electrodes 15 as a mask.

Further, a refractory metal film such as a cobalt film is formed on the entire upper surface of the silicon substrate 10 by a sputtering method. Then, the refractory metal film is heated so as to react with silicon. Accordingly, a refractory silicide layer 22 such as a cobalt silicide layer is formed on the silicon substrate 10 in the first and second source/drain regions 19a and 19b, thereby lowering the resistance of the source/drain regions 19a and 19b.

Thereafter, a portion of the refractory metal layer which remains unreacted on the element isolation insulating film 11 and the like is removed by wet etching.

Up to these steps, the first and second MOS transistors $TR_1$ and $TR_2$ each including the gate insulating film 14, the gate electrode 15, the first and second source/drain regions 19a and 19b, and the like are formed in the active region of the silicon substrate 10.

Next, as depicted in FIG. 14B, a silicon nitride (SiN) film is formed in a thickness of about 200 nm on the entire upper surface of the silicon substrate 10 as the cover insulating film 24 by means of a plasma CVD method. Here, a silicon oxynitride (SiON) film may also be formed as the cover insulating film 24 instead of the silicon nitride film.

Subsequently, as depicted in FIG. 14C, a silicon oxide (SiO) film is formed in a thickness of about 600 nm on this cover insulating film 24 as the base insulating film 25 by the plasma CVD method using TEOS (tetraethoxysilane) gas. Then, the base insulating film 25 is polished to have a thickness of about 200 nm by a CMP (chemical mechanical polishing) method to planarize an upper surface of the base insulating film 25.

Next, steps to obtain a cross-sectional structure depicted in FIG. 14D will be described.

First, a platinum film functioning as a lower electrode conductive film 27 is formed on the base insulating film 25 by the sputtering method. This lower electrode conductive film 27 is patterned and formed into a capacitor lower electrode with a thickness of about 155 nm later.

Further, a PZT film is formed in a thickness of 150 nm to 200 nm on the lower electrode conductive film 27 by the sputtering method. This PZT film is used as a ferroelectric film 28.

Here, in addition to the sputtering method, the method of forming the ferroelectric film 28 includes a MOCVD (metal organic CVD) method and a sol-gel method. Furthermore, the material of the ferroelectric film 28 is not limited only to PZT. It is also possible to form the ferroelectric film 28 by use of a Bi layer structured compound such as $SrBi_2Ta_2O_9$, $SrBi_2(Ta_xNb_{1-x})_2O_9$ or $Bi_4Ti_3O_{12}$. Moreover, the ferroelectric film 28 may be formed by use of PLZT ($Pb_{1-x}La_xZr_{1-y}Ti_yO_3$) formed by doping PZT with lanthanum, and of other metal oxide ferroelectric substances.

Here, the PZT formed by the sputtering method is hardly crystallized immediately after the film formation and therefore has a poor ferroelectric characteristic. Accordingly, RTA (rapid thermal annealing) is carried out for about 90 seconds in an oxygen-containing atmosphere at a substrate temperature of about 585° C. as crystallization annealing for crystallizing the PZT constituting the ferroelectric film 28. Note that this crystallization annealing is not necessary when the ferroelectric film 28 is formed by the MOCVD method.

Next, a first iridium oxide ($IrO_2$) film is formed in a thickness of about 50 nm on the ferroelectric film 28 by the sputtering method, and this first iridium oxide film is subjected to RTA. Conditions of the RTA are not particularly limited. In this embodiment, the substrate temperature for the RTA is set to 725° C. in the oxygen-containing atmosphere and the treatment period is set to 20 seconds.

Thereafter, a second iridium oxide film is formed in a thickness of about 200 nm on the first iridium oxide film by the sputtering method. The laminated film including these first and second iridium oxide films is used as an upper electrode conductive film 29.

Here, an alumina ($Al_2O_3$) film may be formed to have a thin thickness, about 20 nm for example, on the base insulating film 25 by the sputtering method prior to the formation of the lower electrode conductive film 27. By applying this configuration, it is possible to obtain preferable orientation of the platinum constituting the lower electrode conductive film 27 as compared to the case of forming the lower electrode conductive film 27 directly on the base insulating film 25. Moreover, orientation of the PZT constituting the ferroelectric film 28 is aligned by the action of the orientation of the lower electrode conductive film 27, thereby improving the ferroelectric characteristic of the ferroelectric film 28.

Subsequently, as depicted in FIG. 14E, the upper electrode conductive film 29 is patterned by means of photolithography and etching to form the upper electrode 29a. Then, in order to allow the ferroelectric film 28 to recover from damages caused by this patterning process, the ferroelectric film 28 is subjected to recovery annealing in a vertical furnace. This recovery annealing is carried out in an oxygen-containing atmosphere under conditions of a substrate temperature of 650° C. and a treatment period of 60 minutes, for example.

Subsequently, as depicted in FIG. 14F, the ferroelectric film 28 is patterned by means of photolithography and etching to form the capacitor dielectric film 28a made of a ferroelectric material such as PZT. Damages on the capacitor dielectric film 28a caused by this patterning process are recovered by recovery annealing. This recovery annealing is carried out by use of the vertical furnace in the oxygen-containing atmosphere similar to the precedent process while applying conditions of a substrate temperature of 350° C. and a treatment period of 60 minutes.

Next, as depicted in FIG. 14G, a first alumina film 31 for protecting the capacitor dielectric film 28a against a reducing substance such as hydrogen or water is formed in a thickness of about 50 nm on the entire upper surface of the silicon substrate 10 by the sputtering method. Then, in order to allow the capacitor dielectric film 28a to recover from damages caused by this sputtering process, recovery annealing is carried out in the oxygen-containing atmosphere at a substrate temperature of 550° C. for about 60 minutes. This recovery annealing is carried out by use of the vertical furnace, for example.

Subsequently, as depicted in FIG. 14H, the lower electrode conductive film 27 and the first alumina film 31 are patterned by means of photolithography and etching. Accordingly, the lower electrode conductive film 27 below the capacitor dielectric film 28a is formed into the lower electrode 27a and the first alumina film 31 is left so as to cover this lower electrode 27a.

Thereafter, in order to allow the capacitor dielectric film 28a to recover from damages caused in the process, the capacitor dielectric film 28a is subjected to recovery annealing in the vertical furnace under conditions of a substrate temperature of 550° C. and a treatment period of 60 minutes in the oxygen-containing atmosphere.

Up these steps, the capacitor Q formed by stacking the lower electrode 27a, the capacitor dielectric film 28a, and the upper electrode 29a in this order is formed on the base insulating film 25.

Subsequently, as depicted in FIG. 14I, a second alumina film 33 for protecting the capacitor dielectric film 28a is formed in a thickness of about 20 nm on the entire upper surface of the silicon substrate 10 by the sputtering method. This second alumina film 33 has a function to prevent the reducing substance such as hydrogen or water from reaching the capacitor dielectric film 28a in cooperation with the first alumina film 31 located therebelow and thereby to suppress deterioration of the ferroelectric characteristic of the capacitor dielectric film 28a due to the reduction thereof.

Thereafter, the capacitor dielectric film 28a is subjected to recovery annealing in the vertical furnace having the oxygen-containing atmosphere under conditions of a substrate temperature of 550° C. and a treatment period of 60 minutes.

Moreover, as depicted in FIG. 14J, a silicon oxide film is formed in a thickness of about 1500 nm on the second alumina film 33 by the plasma CVD method using a TEOS gas, and the silicon oxide film is used as the first interlayer insulating film 34. Thereafter, an upper surface of the first interlayer insulating film 34 is polished and planarized by the CMP method.

Next, steps to obtain a cross-sectional structure depicted in FIG. 14K will be described.

First, the first interlayer insulating film 34, the second alumina film 33, the base insulating film 25, and the cover insulating film 24 are patterned by means of photolithography and dry etching to form first and second contact holes 35a and 35b in these films.

These first and second contact holes 35a and 35b are formed over the first and second source/drain regions 19a and 19b.

Thereafter, a titanium (Ti) film and a titanium nitride (TiN) film are formed respectively in thicknesses of 20 nm and 50 nm on inner surfaces of the first and second contact holes 35a and 35b and on an upper surface of the first interlayer insulating film 34 by the sputtering method. These films are collectively used as a glue film. Subsequently, a tungsten film is formed on this glue film by the CVD method using a tungsten hexafluoride gas. The first and second contact holes 35a and 35b are completely filled with this tungsten film.

Then, excessive portions of the glue film and tungsten film on the first interlayer insulating film 34 are polished and removed by the CMP method so that these films are left only in the first and second contact holes 35a and 35b.

The glue film and tungsten film thus left in the first and second contact holes 35a and 35b constitute first and second contact plugs 40a and 40b which are electrically connected to the first and second source/drain regions 19a and 19b.

Here, the first and second contact plugs 40a and 40b are made mainly of tungsten which is extremely susceptible to oxidation. Therefore, these plugs 40a and 40b might be easily oxidized in the oxygen-containing atmosphere and cause contact defects.

To deal with this problem, in a subsequent step, as depicted in FIG. 14L, a silicon oxy-nitride film serving as an anti-oxidation insulating film 41 is formed in a thickness of about 100 nm on the entire upper surface of the silicon substrate 10 by using the CVD method. Oxidation of the first and second contact plugs 40a and 40b is prevented by use of this anti-oxidation insulating film 41.

Thereafter, the layers from the anti-oxidation insulating film 41 to the first alumina film 31 are patterned by means of photolithography and etching to form a first opening 35d in these insulating films over the upper electrode 29a and to form a second opening 35e in the insulating films over the lower electrode 27a.

Thereafter, in order to allow the capacitor dielectric film 28a to recover from damages caused so far, the capacitor dielectric film 28a is subjected to a sixth recovery annealing by putting the silicon substrate 10 into the vertical furnace filled with the oxygen-containing atmosphere. This recovery annealing is performed under the condition of, for example, a substrate temperature of 500° C. and a treatment period of 60 minutes.

Next, as depicted in FIG. 14M, a metal lamination film is formed on each upper surface of the first interlayer insulating film 34 as well as the first and second contact plugs 40a and 40b. The metal lamination film thus formed is used as a first conductive film 41. In this embodiment, a titanium nitride film having a thickness of about 150 nm, a copper-containing aluminum film having a thickness of about 550 nm, a titanium film having a thickness of about 5 nm, and another titanium nitride film having a thickness of 150 nm are formed in this order as the metal lamination film. This metal lamination film is also formed in the first and second openings 35d and 35e over the capacitor Q.

Further, a photoresist is coated on this first conductive film 41, and a first resist pattern 42 is formed by exposing and developing the photoresist.

Subsequently, as depicted in FIG. 14N, first-layer metal interconnections 41a and 41b are formed over the first interlayer insulating film 34 by etching the first conductive film 41 while using the first resist pattern 42 as a mask.

The first-layer metal interconnection 41a formed over the capacitor Q is electrically connected to the upper electrode 29a and the lower electrode 27a via the first and second openings 35d and 35e, respectively.

Moreover, the first-layer metal interconnection 41b formed over the second source/drain region 19b constitutes a part of a bit line together with the second contact plug 40b.

Then, after the first resist pattern 42 is removed, the first interlayer insulating film 34 is annealed and dehydrated by use of the vertical furnace filled with a nitrogen atmosphere under conditions of a substrate temperature of 350° C., a $N_2$ flow rate of 20 L/min, and a treatment period of 30 minutes, for example.

Next, steps to obtain a cross-sectional structure depicted in FIG. 14O will be described.

First, an alumina film serving as a first capacitor protection insulating film 46 is formed on the entire upper surface of the silicon substrate 10.

This first capacitor protection insulating film 46 has a function to protect the capacitor dielectric film 28a by blocking the reducing substance such as hydrogen or water. Instead of the alumina film, a titanium oxide ($TiO_2$) film may also be employed as the insulating film having the same function.

Next, a silicon oxide film serving as the second interlayer insulating film 47 is formed on the first capacitor protection insulating film 46 by the plasma CVD method using a TEOS gas as a reaction gas, and then an upper surface of this second interlayer insulating film 47 is polished and planarized by the CMP method. After planarization, the second interlayer insulating film 47 has a thickness of about 1000 nm at positions over the first-layer metal interconnections 41a and 41b.

Then, this second interlayer insulating film 47 is dehydrated by means of a $N_2O$ plasma treatment. Thereafter, in order to prevent the reducing substance such as hydrogen or water included in the outside atmosphere from reaching the capacitor dielectric film 28a, an alumina film having an excellent blocking property against these substances is formed in a thickness of about 50 nm on the second interlayer insulating film 47 by the sputtering method. This alumina film is used as a second capacitor protection insulating film 48.

Note that the second capacitor protection insulating film 48 is not limited only to the alumina film. Similar to the first capacitor protection insulating film 46, a titanium oxide film may also be formed as the second capacitor protection insulating film 48 instead.

Here, prior to the formation of the second capacitor protection insulating film 48, it is also preferable to form a silicon oxide film in a thickness of about 100 nm on the second interlayer insulating film 47 by the CVD method using a TEOS gas and then to dehydrate this silicon oxide film by means of a $N_2O$ plasma treatment.

Subsequently, a silicon oxide film is formed on the second capacitor protection insulating film 48 by the plasma CVD method using a TEOS gas, and this silicon oxide film is used as a first cap insulating film 49. This first cap insulating film 49 has a thickness of about 100 nm, for example.

Thereafter, this first cap insulating film 49 is dehydrated by means of a $N_2O$ plasma treatment.

Next, steps to obtain a cross-sectional structure depicted in FIG. 14P will be described.

First, the insulating films 46 to 49 are patterned by means of photolithography and etching to form a first hole 50a over the first-layer metal interconnection 41b.

Subsequently, a titanium nitride film serving as a glue film is formed to a thickness of about 150 nm on the second interlayer insulating film 47 and on the inner surface of the first hole 50a.

Further, a tungsten film is formed on this glue film by the plasma CVD method using a tungsten hexafluoride gas. The first hole 50a is completely filled with this tungsten film.

Thereafter, excessive portions of the glue film and tungsten film on the first cap insulating film 49 are polished and removed by the CMP method, so that these films is left only in the first hole 50a. Here, an etch-back method may be used in this process instead of the CMP method.

The glue film and tungsten film thus left in the first hole 50a constitute a first conductive plug 57a which is electrically connected to the first-layer metal interconnection 41b.

Subsequently, as depicted in FIG. 14Q, a metal lamination film is formed as a second conductive film 55 on each of the first cap insulating film 49 and the first conductive plugs 57a. This metal lamination film is used as a first conductive film 41. The metal lamination film has a copper-containing aluminum film having a thickness of about 550 nm, a titanium film having a thickness of about 5 nm, and a titanium nitride film having a thickness of 150 nm stacked in this order from the bottom, for example.

Further, a photoresist is coated on this second conductive film 55, and a second resist pattern 56 is formed by exposing and developing the photoresist.

Next, as depicted in FIG. 14R, a second-layer metal interconnection 55a is formed by dry-etching the second conductive film 55 while using the second resist pattern 56 as a mask.

Thereafter, the second resist pattern 56 is removed.

Subsequently, as depicted in FIG. 14S, a silicon oxide film is formed in a thickness of about 2200 nm on each of the first cap insulating film 49 and the second-layer metal interconnection 55a by the plasma CVD method using a TEOS gas. The silicon oxide film thus formed is used as a third interlayer insulating film 51.

Then, after an upper surface of the third interlayer insulating film 51 is polished and planarized by the CMP method, the third interlayer insulating film 51 is dehydrated by a $N_2O$ plasma treatment. The $N_2O$ plasma treatment is carried out by use of a CVD apparatus and under conditions of a substrate temperature of 350° C. and a treatment period of 4 minutes, for example.

Next, an alumina film serving as a third capacitor protection insulating film 52 for protecting the capacitor dielectric film 28a against the reducing substance is formed to a thickness of about 50 nm on the third interlayer insulating film 51 by the sputtering method. A titanium oxide film may be formed as the third capacitor protection insulating film 52 instead of the alumina film.

Here, prior to the formation of the third capacitor protection insulating film 52, it is preferable to form a silicon oxide film to a thickness of about 100 nm on the third interlayer insulating film 51 by the CVD method using a TEOS gas and then to dehydrate this silicon oxide film by means of a $N_2O$ plasma treatment.

Subsequently, a silicon oxide film is formed to a thickness of about 100 nm on the third capacitor protection insulating film 52 by the plasma CVD method using a TEOS gas, and this silicon oxide film is used as a second cap insulating film 53.

Thereafter, the second cap insulating film 53 is subjected to a $N_2O$ plasma treatment in the CVD apparatus and under conditions of a substrate temperature of 350° C. and a treatment period of 2 minutes, thereby dehydrating the second cap insulating film 53.

Next, as depicted in FIG. 14T, a photoresist is coated on the second cap insulating film 53. Then, a third resist pattern 58 provided with a window 58a over the second-layer metal interconnection 55a is formed by exposing and developing the photoresist.

Subsequently, a second hole 54a is formed over the second-layer metal interconnection 55a by dry-etching the insulating films 51 to 53 through the window 58a.

The third resist pattern 58 is removed after completion of this etching process.

Next, steps to obtain a cross-sectional structure depicted in FIG. 14U will be described.

First, a titanium nitride film serving as a glue film is formed to a thickness of about 50 nm on the second cap insulating film 53 and on the inner surface of the second hole 54a by the sputtering method. Then, a tungsten film having a thickness sufficient for completely filling in the second hole 54a, such as a thickness of about 650 nm, is formed on the glue film by the CVD method.

Thereafter, excessive portions of the glue film and tungsten film on the second cap insulating film 53 are polished and removed by the CMP method, so that these films are left only in the second hole 54a as a second conductive plug 56a.

Subsequently, as depicted in FIG. 14V, an aluminum film 60a is formed to a thickness of about 500 nm on each upper surface of the second conductive plug 56a and the second cap insulating film 53 by the sputtering method. This aluminum film 60a also contains copper.

Further, a titanium nitride film 60b is formed to a thickness of about 150 nm on the aluminum film 60a by the sputtering method. This titanium nitride film 60b and aluminum film 60a are collectively used as a third conductive film 60.

Thereafter, a photoresist is coated on this third conductive film 60, and a fourth resist pattern 62 is formed by exposing and developing the photoresist.

Subsequently, as depicted in FIG. 14W, a third-layer metal interconnection 60c and a bonding pad 60d are formed by etching the third conductive film 60 while using the fourth resist pattern 62 as a mask.

The fourth resist pattern 62 is removed thereafter.

Next, as depicted in FIG. 14X, a silicon oxide film is formed to a thickness of about 100 nm over the silicon substrate 10 by the CVD method using a TEOS gas. The silicon oxide film thus formed is used as the first passivation film 65.

Subsequently, the first passivation film 65 is subjected to a $N_2O$ plasma treatment. Accordingly, the first passivation film 65 is dehydrated and a surface thereof is nitrided to prevent reabsorption of water. Such a N₂O plasma treatment is performed under conditions of a substrate temperature of 350° C. and a treatment period of 2 minutes, for example.

Further, a silicon nitride film serving as the second passivation film 66 is formed to a thickness of about 350 nm on this first passivation film 65 by the CVD method.

Thereafter, a photoresist is coated on the second passivation film 66, and a fifth resist pattern 67 provided with a window 67a over the third-layer metal interconnection 65 is formed by exposing and developing the photoresist.

Subsequently, as depicted in FIG. 14Y, the first and second passivation films 65 and 66 are dry-etched by using this fifth resist pattern 67 as a mask, whereby a third opening 66a is formed in these films as illustrated in the drawing. This dry etching process is performed by use of an unillustrated parallel plate plasma etching apparatus, for example. Here, a mixed gas of $CHF_3$, $CF_4$, and $O_2$ is employed as an etching gas.

The fifth resist pattern 67 is removed thereafter.

Next, as depicted in FIG. 14Z, a resin film mainly composed of a photosensitive novolac resin is coated with a thickness of about 3.6 μm on the second passivation film 66 and in the third opening 66a. Then, the resin film is baked at a substrate temperature of about 110° C. to evaporate and remove a solvent component included in the resin film. Thus, a coated film 68b containing a novolac resin is formed.

Subsequently, as depicted in FIG. 15, the coated film 68b is exposed and developed to form a window 68a exposing the bonding pad 60d. Thereafter, the coated film 68b is cured for 40 minutes in a nitrogen atmosphere having a flow rate of 100 L/min and at a substrate temperature of 180° C., so that the novolac resin in the coated film 68b is completely crosslinked. Thereby, the coated film 68 is made into the protection insulating film 68.

Up to these steps, the basic structure of the FeRAM according to the present embodiment is completed.

According to the present embodiment described so far, the coated film 68b is formed by baking the resin film containing the novolac resin.

While a relatively high substrate temperature of about 250° C. to 350° C. is required for curing a polyimide film, the coated film 68b mainly composed of the novolac resin can be cured at a relatively low substrate temperature of about 160° C. to 180° C. This makes it possible to reduce damages on the ferroelectric capacitor Q due to the heat applied for curing the coated film 68b.

In addition, as compared to the case of curing the polyimide film, the coated film 68b mainly composed of the novolac resin generates less water when the coated film 68b is cured. This makes it possible to prevent the capacitor dielectric film 28a from being reduced by the reducing substance such as water and from causing deterioration of the ferroelectric characteristic thereof.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alternations could be made hereto without departing from the spirit and scope of the invention.

What is claimed is:

1. A heat treatment apparatus comprising:
a treatment chamber housing a semiconductor substrate;
a heater provided in the treatment chamber and heating the semiconductor substrate;
an atmosphere adjustment mechanism reducing a concentration of oxygen contained in an atmosphere in the treatment chamber to less than an oxygen concentration in an air, where the atmosphere adjustment mechanism comprises a circulation path which circulates the atmosphere, the atmosphere being circulated within the treatment chamber; and
an oxygen trap provided in the circulation path for the atmosphere and selectively removing oxygen from the atmosphere; and
a hydrogen trap provided in the circulation path for the atmosphere and selectively removing hydrogen from the atmosphere.

2. The heat treatment apparatus according to claim 1, wherein an introduction path for a cooling gas of room temperature is joined to the circulation path at a position upstream of the oxygen trap.

3. The heat treatment apparatus according to claim 2, wherein the cooling gas is any one of air and nitrogen gas.

4. The heat treatment apparatus according to claim 1, wherein an oxygen concentration meter is provided in the treatment chamber, where the oxygen concentration meter measuring the oxygen concentration in the atmosphere .

5. The heat treatment apparatus according to claim 1, wherein a hydrogen concentration meter is provided in the treatment chamber, where the hydrogen concentration meter measuring the hydrogen concentration in the atmosphere.

6. The heat treatment apparatus according to claim 1, further comprising:
a door which shields the treatment chamber from outside air; and
a partition wall provided in the treatment chamber, the partition wall being openable and closable,
wherein the partition wall partitions the treatment chamber into a first treatment chamber located next to the door and a second treatment chamber located farther from the door, and
the heater and the atmosphere adjustment mechanism are provided in each of the first treatment chamber and the second treatment chamber.

7. The heat treatment apparatus according to claim 6, wherein a volume of the first treatment chamber is smaller than a volume of the second treatment chamber.

* * * * *